(12) United States Patent
Ikeda

(10) Patent No.: US 7,750,702 B2
(45) Date of Patent: Jul. 6, 2010

(54) PULSE GENERATION CIRCUIT AND UWB COMMUNICATION DEVICE

(75) Inventor: Masayuki Ikeda, Shiojiri (JP)

(73) Assignee: Seiko Epson Corporation, Shinjuku-ku, Tokyo (JP)

(*) Notice: Subject to any disclaimer, the term of this patent is extended or adjusted under 35 U.S.C. 154(b) by 0 days.

(21) Appl. No.: 12/250,801

(22) Filed: Oct. 14, 2008

(65) Prior Publication Data
US 2009/0108901 A1 Apr. 30, 2009

(30) Foreign Application Priority Data
Oct. 15, 2007 (JP) ............................ 2007-267490

(51) Int. Cl.
*H03K 7/08* (2006.01)
(52) U.S. Cl. ...................... 327/172; 327/176
(58) Field of Classification Search ......... 327/171–174, 327/176, 178, 165, 166
See application file for complete search history.

(56) References Cited

U.S. PATENT DOCUMENTS

| 6,421,389 | B1 | 7/2002 | Jett et al. | |
|---|---|---|---|---|
| 6,833,736 | B2* | 12/2004 | Nakazato et al. | 327/34 |
| 6,911,874 | B2* | 6/2005 | Dvorak | 332/112 |
| 6,927,613 | B2* | 8/2005 | Huynh et al. | 327/172 |
| 7,030,663 | B2* | 4/2006 | McCorkle et al. | 327/108 |
| 7,088,162 | B2* | 8/2006 | Ochoa et al. | 327/225 |
| 2001/0033576 | A1 | 10/2001 | Richards | |
| 2003/0108133 | A1 | 6/2003 | Richards | |

OTHER PUBLICATIONS

Barajas, E. et al.; "A Low-Power Template Generator for Coherent Impulse-Radio Ultra Wide-Band Receivers" (Abstract only); *The 2006 IEEE 2006 International Conference on Ultra-Wideband*; Sep. 2006; pp. 97-102; Waltham, Mass. Available Web Site: ieeexplore.ieee.org Accessed on: May 26, 2008.
Terada, T. et al.; "A CMOS Impulse Radio Ultra-Wideband transceiver for 1 Mb/s data communications and ±2.5cm range findings"; *2005 Symposium on VLSI Circuits Digest of Technical Papers*; 2005; pp. 30-33; Kyoto, Japan.

* cited by examiner

*Primary Examiner*—Hai L Nguyen
(74) *Attorney, Agent, or Firm*—Townsend and Townsend and Crew, LLP

(57) ABSTRACT

A pulse generation circuit for outputting to an output terminal (OT) includes an inverter delay circuit (IDC) for processing a start signal with a predetermined delay; a first switching circuit (SC) adapted to connect the OT to a first voltage when a logical product of the IDC is true, and to connect the OT to a second voltage when a logical sum of the IDC is false; a second SC adapted to connect the OT to the first voltage when a logical product of the IDC is true, and to connect the OT to the second voltage when a logical sum of the IDC is false; and a start signal control circuit adapted to input the start signal to the IDC with a delay when the first SC is activated, and to input the start signal to the IDC without the delay when the second SC is activated.

5 Claims, 15 Drawing Sheets

PULSE GENERATION CIRCUIT AND UWB COMMUNICATION DEVICE

BACKGROUND

1. Technical Field

The present invention relates to a pulse generation circuit for generating pulses suitable for Ultra Wide Band (UWB) communication, and a UWB communication device.

2. Related Art

The UWB communication is a communication method for performing high-speed large-capacity data communication using a very wide frequency band. Although as the communication method using wide-band signals, there are cited a spread spectrum system and orthogonal frequency division multiplexing (OFDM) in the related art, the UWB is a further wide-band communication method using pulses with very short period of time, and is also called impulse radio (IR) communication. In the IR systems, modulation and demodulation can be performed only by time-base operations in contrast to the modulation in the related art, and simplification of the circuit and reduction of power consumption are considered to be expected (see the specifications of U.S. Pat. No. 6,421,389, US-A1-2003/0108133, and US-A1-2001/0033576).

Hereinafter, pulse waveforms used for the IR systems will briefly be explained with reference to the drawings.

The pulse train with a pulse width $P_D$ and a period $T_P$ shown in FIG. 18A, as well known, has a frequency spectrum, which is a sinc function with an envelope having the first zero point at the frequency of $BW=1/P_D$ as shown in FIG. 18B.

The pulse as shown in FIG. 18B is hard to use because the pulse has the spectrum extending from direct-current to BW, and the pulse having the center frequency $f_0$ of the spectrum in a high frequency band as shown in FIG. 18D has the preference.

This pulse waveform is obtained by cutting rectangular waves with the frequency $f_0=1/(2P_W)$ from the pulse shown in FIG. 18A to shift the frequency spectrum towards a higher frequency. It should be noted that this waveform includes the direct-current (DC) component as illustrated with the dashed line 1301 in FIG. 18C, and therefore, does not have the ideal spectrum as shown in FIG. 18D, to be exact.

The waveform having such an ideal spectrum is shown in FIG. 18E. This waveform is obtained by multiplying the pulses shown in FIG. 18A by the sinusoidal wave with the carrier frequency $f_0$. Further, FIG. 18F shows a waveform obtained by multiplying the pulses shown in FIG. 18A by a rectangular wave with the carrier frequency $f_0$, which can easily be generated by a digital circuit. Since the pulse width is so narrow that such a square waveform is not formed even by the digital circuit, the waveform shown in FIG. 18E can be obtained. Although there are designed various other pulse waveforms ideal for the UWB communication different from the waveform shown here, since the generation method is simple, it is used frequently.

RELATED EXAMPLE 1

FIG. 11 shows a circuit example of the related art for generating the pulses shown in FIG. 18C (see A CMOS IMPULSE RADIO ULTRA-WIDEBAND TRANSCEIVER FOR 1 Mb/s DATA COMMUNICATION AND ±2.5 cm RANGE FINDINGS (T. Terada et. al, 2005 Symposium on VLSI Circuits Digest of Technical Papers, pp. 30-33)). Two inverters 801, 802 and a negative OR circuit (NOR) 803 form a three-stage ring oscillator circuit when the other input Ci of the NOR 803 becomes false (L: a low level). In other words, as shown in the time chart of FIG. 12, the oscillation is caused only while the input Ci is in L, the transitions in the output NR of the NOR 803 and the outputs N1, N2 of the inverters 801, 802 are propagated sequentially with delay time $t_d$.

Here, it is assumed that the rising time and the falling time are the same throughout the NOR 803 and the inverters 801, 802 for the sake of simplicity. Therefore, the width ($P_W$ in FIG. 18C) of the pulse generated by this circuit becomes $3t_d$. In other words, the pulse width three times as long as the delay time of the element forming the circuit is the smallest possible width of the pulse generated, which forms the upper limit of the thinnest possible pulse generated by the circuit.

RELATED EXAMPLE 2

As a circuit for generating thinner pulses than those generated by the circuit described above, the following circuit has been designed. Further, the pulses the circuit described above can generate include a DC component. As the circuit for generating such pulses without a DC component as shown in FIGS. 18E and 18F, there is cited a circuit shown in FIG. 13. The time chart of FIG. 14 is provided for explaining the operation of the circuit.

In FIG. 13, delay circuits (inverters) 900 through 909 are composed of ten stages of inverters connected in series. The internal configuration of each stage of the inverters will be described later with reference to FIG. 15.

A pulse D0 input to a terminal 933 is propagated in the delay circuits while being the delay time $t_d$ delayed and inverted in logic in every stage, and output from each of the stages as shown in FIG. 14. Specifically, assuming that the signal applied to the input terminal 933 is positive logic, XDi is output from the ith stage if i is an odd number, or Di is output therefrom if i is an even number. It should be noted that X is a symbol attached to the front of a name of a signal for representing the inverted logic of the signal.

N-channel MOS transistors 913 and 912 each become a conducting state to connect a pulse output terminal 930 (described as PulseOut in the drawing) to a first voltage level 929 (V1) when the output XD1 of the first stage and the output D2 of the second stage of the delay circuits are in the high level. Then, P-channel MOS transistors 911 and 910 each become a conducting state to connect the pulse output terminal 930 to a second voltage level 926 (V2) when the output D2 of the second stage and the output XD3 of the third stage of the delay circuits are in the low level (i.e., both of the inverted logic of D2 and D3 are in the high level (the logical product thereof is true)).

Similarly, N-channel MOS transistors 916, 917, 920, 921, 924, and 925 each become a conducting state to connect the pulse output terminal 930 to the first voltage level V1 when the output XDi−1 of the i−1th stage and the output Di of the ith stage of the delay circuits are in the high level, namely, when the logical product of XDi−1 and Di is true. Here, is an even number. Then, P-channel MOS transistors 914, 915, 918, 919, 922, and 923 each become a conducting state to connect the pulse output terminal 930 to the second voltage level V2 when the output Di of the ith stage and the output XDi+1 of the i+1th stage of the delay circuits are in the low level, namely, when the logical product of the inverted output XDi of the output Di and the inverted-logic output Di+1 of the output XDi+1 is true.

The pulse waveform shown in the part M of FIG. 14 can be obtained by the operation described above, thus the pulse waveform as shown in FIG. 18E or 18F can be generated.

Here, although it is possible to use the negative and positive power supply voltages VSS, VDD of the integrated circuits forming the circuit as the first and second voltage levels, it is also possible to set other arbitrary voltages as the first and second voltages.

A P-channel MOS transistor 927 and an N-channel MOS transistor 928 are MOS resistors, which divide the first and second voltages V1, V2 to set the voltage (V0) of the output terminal 930 when the switching circuits of the MOS transistors 910 through 925 connect the output terminal 930 to neither the first voltage V1 nor the second voltage V2. Typically, the voltage is designed to have an intermediate value between the first and second voltages V1, V2 so as to keep the symmetric property of the constant of the N- and P-channel transistors. Further, transistors 931, 932 have a function of pulling back the potential to V0 in a time period $t_9$ shown in FIG. 14, namely at the trailing edge of the pulse thus generated. Although the transistors 927 and 928 also pull back the potential to V0, since these transistors have high on-resistances, it takes long time before the potential reaches V0, which makes it difficult to generate a correct pulse. The transistors 931 and 932 discharge the charge stored in the load capacitance of the output terminal 930 to try to make the potential of the pulse output terminal 930 become the first voltage V1. Therefore, it is designed that the potential becomes V0 just in the time period $t_9$ by adjusting the on-resistances of the transistors 931 and 932, or by adjusting the amount of delay of the delay circuit 909 to become shorter.

FIG. 15 is a diagram showing the internal configuration of each of the inverters 900 through 909 forming the delay circuits. A P-channel MOS transistor 1002 and an N-channel MOS transistor 1003 form the inverter circuit, and the signal input to a terminal 1008 is output from a terminal 1010 with the delay time $t_d$ and inverted, thus forming a delay circuit input 1010 of the following stage. At the same time, the signal is taken out through a small buffer circuit 1005 so as not to increase the delay amount of the delay circuit formed of the transistors 1002, 1003, and further, an output 1011 is taken out therefrom by a buffer circuit 1006 to drive the transistors 910 through 925, 931, and 932 shown in FIG. 13, respectively. It should be noted that the buffers 1005, 1006 are omitted in FIG. 13.

An N-channel transistor 1004 is inserted in series to the source of the transistor 1003 forming the inverter described above and is connected to the negative power supply while a P-channel transistor 1001 is inserted in series to the source of the transistor 1002 forming the inverter and is connected to the positive power supply VDD 1017.

By controlling the gate-source voltages Vbp, Vbn of these transistors 1001, 1004, it is possible to control the power supply current flowing into the inverter. Typically, the voltages Vbp and Vbn are controlled to have the absolute values equal to each other for keeping the symmetrical property of the leading edge and trailing edge of the delay circuit output. This control makes it possible to control the operation speed of the inverter, thus controlling the delay time $t_d$. In order for generating the pulse having the target frequency spectrum, it is enough only to control voltages of terminals 1007 and 1009 so as to achieve $P_W = t_d$.

RELATED EXAMPLE 3

In the UWB communication, the pulses thus generated are not only used in transmitters but also used in receivers as the template pulse for calculating correlation with received signals. In the receivers, differential signal processing is often executed, and in many cases, a pair of signals having phases reversed to each other as shown in FIG. 18G are required. The differential pulse signals are also effective for the transmitter in the case of driving a balanced antenna. Further, in receiving circuits, there is often the case in which a so-called IQ signal including an in-phase signal and a quadrature signal having phases 90° different from each other is required.

A Low-Power Template Generator for Coherent Impulse-Radio Ultra Wide-Band Receivers (Jose Luis et al., Proceedings IEEE ICUWB, 2006 pp. 97-102) presents a circuit for generating balanced pulses. This circuit has some stages of differential delay circuits cascaded to generate a pulse train with a pulse width corresponding to an amount of delay of each of the stages of delay circuits using a logic circuit. This document also suggests a possibility of starting the pulse by both of a rising edge and a falling edge of the signal input to the delay circuit, thereby reducing power consumption, and a possibility of using the delay circuit every other stage, thereby generating the IQ signal.

FIG. 16 shows an example of the pulse generation circuit along the suggestion described above. A circuit for generating a unipolar pulse instead of a differential pulse is shown for the sake of simplicity of explanations. This circuit can be configured by further adding a switch array to the circuit shown in FIG. 13. The same elements as in FIG. 13 are denoted with the same reference numerals in FIG. 16 for the sake of simplicity of explanations, and explanations therefor will be omitted. The switch array thus added is composed of a switch array 1101, and P-channel transistors 1102, 1103. The switch array 1101 has the same configuration as the circuit 1104 inside the area surrounded by the double dashed line in the drawing, and uses the respective gates G1a, G1b, G1c, G2a, G2b, G2c, G3a, G3b, G3c, G4a, G4b, and G4c as the control terminals of the switches, thus connecting the output terminal PO to the first voltage level V1 when both of the Gia and Gib are in the H level. Here, i is an index representing 1 through 4. Further, the output terminal PO is connected to the second voltage level V2 when both of the Gib and Gic are in the L level.

Hereinafter the operation will be explained with reference to FIG. 17 showing the time chart representing the operation. In the drawing, periods xt1 through xt9 correspond to the pulses generated by the switch array 1104 and the switch transistors 931, 932. Since these pulses are the same as those generated by the circuit explained with reference to FIG. 13, the explanation therefor will be omitted. According to this technology of the related art, pulses are generated (in the periods t0 through t9) in response to a rising edge of the D0 in addition to the pulse generation (in the periods xt0 through xt9) responsive to a falling edge of the D0.

Specifically, the switch array 1104 connects the pulse output terminal 930 to the first voltage level V1 (i is an even number) when the output XDi−1 of the i−1th stage and the output Di of the ith stage of the delay circuits are in the high level, namely when the logical product of XDi−1 and Di is true, and connects the pulse output terminal 930 to the second voltage level V2 when the output Di of the ith stage and the output XDi+1 of the i+1th stage of the delay circuits are in the low level, namely when the logical product of XDi, the inversion of Di, and Di+1, the inversion logic of XDi+1, is true. In contrast, the switch array 1101 connects the pulse output terminal 930 to the second voltage level V2 (i is an even number) when the output XDi−1 of the i−1th stage and the output Di of the ith stage of the delay circuits are in the low level, namely when the logical product of Di−1, the inversion of XDi−1, and XDi, the inversion of Di, is true, and connects the pulse output terminal 930 to the first voltage level V1 when the output Di of the ith stage and the output XDi+1 of the i+1th stage of the delay circuits are in the high level, namely when the logical product of Di, and XDi+1 is true.

The transistors 1102, 1103 function of pulling back the voltage of the pulse output terminal to the voltage determined by the transistors 927, 928 when the XD9 and the D10 are in the high level, namely in the period t9.

Table 1 collectively shows a connection method of the switch arrays 1104 and 1101 described above.

TABLE 1

|  | G1a | G1b | G1c | G2a | G2b | G2c | G3a | G3b | G3c | G4a | G4b | G4c |
|---|---|---|---|---|---|---|---|---|---|---|---|---|
| SWITCH ARRAY 1104 | XD1 | D2 | XD3 | XD3 | D4 | XD5 | XD5 | D6 | XD7 | XD7 | D8 | XD9 |
| SWITCH ARRAY 1101 | XD3 | D2 | XD1 | XD5 | D4 | XD3 | XD7 | D6 | XD5 | XD9 | D8 | XD7 |

By adding such connections, it becomes possible to add the pulse train (the periods t0 through t9) generated in response to a rising edge of the D0, thus triggering the circuit with both edges of the start signal. The inverter delay circuit 1105, which has the largest power consumption of the pulse generation circuit, consumes the power when the states of the inverters in the respective stages are inverted. Since the pulse is output every time the state of the inverter delay circuit is inverted in this related example, the power efficiency is improved in comparison with the case in which the pulse is generated in response only to either one of a rising edge and a falling edge as in the related example 2.

Since the pulse width is usually vary small, the pulse output waveform like the waveform Pout, which is illustrated assuming that the speed of the switching elements is sufficiently high, is not obtained, but a waveform like the waveform Poutc obtained by integrating the Pout with a capacitive load is output. It is preferable for obtaining pulses having the good balance between the positive level and the negative level (without the DC component) that the width of the pulses output in the periods t1, t9, xt1, xt9 is a half of the delay time $t_d$. If such a condition is not satisfied, the waveform of the output becomes biased towards the positive side or the negative side.

The pulse generation circuits of the related art described above each have an advantage and a disadvantage, and therefore all have respective problems. Firstly, the related example 1 described above is not capable of generating the pulses in a necessary band (i.e., with a necessary pulse width) in many cases. In the related example 2, although the thin pulses corresponding to the performance limitation of the elements forming the circuit can be generated, there is a disadvantage of large power consumption as described above. Although the related example 3 described above is designed in order for overcoming this disadvantage, this related art has following disadvantages.

Firstly, as is obvious from the time chart shown in FIG. 17, the pulses generated in response to a rising edge and the pulses generated in response to a falling edge are reversed in the pulse polarity. This imposes a significant restriction on the modulation operation or generation of the template waveform for the demodulation when configuring a UWB transmitter/receiver using this circuit.

Further, in this related art, the generated pulses are started in response to the both edges, namely the rising edge and the falling edge of the start pulse D0, and the logic circuits thereafter are respectively formed of completely complementary circuits having positive and negative logic of Boolean algebra revered to each other. The complementary circuits formed of logic circuits made, for example, of CMOS and having an insufficiently symmetric property obviously generate pulses having insufficient symmetric property. In other words, in the pulse generation circuits according to the related art, in most cases, the pulses started in response to the rising edge of the D0 and the pulses started in response to the falling edge thereof are different from each other in the amplitude, or have symmetric properties in the polarity (the position of the DC level) shifted from each other. In the case with the UWB, since the operation in the frequency band as high as the performance limitation of the elements is forced, it is difficult to assure a completely complementary operation even by designing with attention on the symmetric property between the P-channel and the N-channel, and therefore, it is quite difficult to generate accurate pulses with a preferable symmetric property.

Further, in order for obtaining the differential pulse signal, it is required to add another pair of circuits described above in a complementary manner, the problem becomes more complicated in order for obtaining the differential pulse signal with a good symmetric property, and realization thereof is difficult.

Further, the transistors 927, 928 (FIG. 13) for fixing the intermediate voltage are always in an on-state to make the leakage current flow therethrough. This causes wasteful power consumption.

SUMMARY

Therefore, an advantage of the invention is to solve all of the problems of the circuits in the related art described above to realize a circuit for generating accurate and short pulses with small power consumption.

In order for solving the above problems, the technologies listed below will be proposed in the present application.

APPLICATION EXAMPLE 1

A pulse generation circuit according to the application example 1 is a pulse generation circuit for outputting a pulse with a predetermined shape to an output terminal in response to a start signal includes an inverter delay circuit including an inverter train having a plurality of stages of inverters connected in series and each executing logic inversion on the start signal with a predetermined amount of delay, a first switching circuit adapted to connect the output terminal to a first voltage V1 when a logical product of an output Di (i denotes an even number in a predetermined range) of an ith stage and an output XDi−1 of an i−1th stage of the inverter delay circuit is true, and to connect the output terminal to a second voltage V2 when a logical sum of the output Di of the ith stage and an output XDi+1 of an i+1th stage of the inverter delay circuit is false, a second switching circuit adapted to connect the output terminal to the first voltage V1 when a logical product of the output Di of an ith stage and the output XDi+1 of the i+1th stage of the inverter delay circuit is true, and to connect the output terminal to the second voltage V2 when a logical sum of the output XDi+1 of the i+1th stage and an output Di+2 of an i+2th stage of the inverter delay circuit is false, and a drive signal control circuit adapted to input the start signal to the inverter delay circuit with a delay equal to an amount of delay of every stage of the inverter delay circuit when the first switching circuit is activated, and to input the start signal to the inverter delay circuit without the delay when the second switching circuit is activated.

In the pulse generation circuit according to the application example 1, when the logic of the second switching circuit is changed such that the output of the inverter delay circuit is shifted one stage such as Di→XDi−1, XDi+1→Di, or Di+2→XDi+1 and inverted in logic, the resulting output matches the logic of the first switching circuit. Thus, it becomes possible to generate the pulses in response to both of the rising edge and the falling edge of the start signal input to the inverter delay circuit, further since the pulses are generated every time the inverter delay circuit, which consumes most of the power consumed in the circuit, is inverted, the power consumption of the circuit per pulse generated can be reduced to a half thereof. Moreover, as described above, since the circuit has the completely symmetric connections between the inverter delay circuit and the switching circuit, no difference is caused between the pulse waveforms generated in response to the rising edge of the start signal and the pulse waveforms generated in response to the falling edge of the start signal. Further, although the pulse generated when the second switching circuit is activated is shifted from the pulse generated when the first switching circuit is activated as much as the amount of delay of each stage of the inverter delay circuit, since the shift is corrected by the start signal control circuit described above, the period from the both of the rising edge and the falling edge of the start signal to when the pulse is generated becomes constant. Thus, the pulse generation circuit according to the application example of the invention can dramatically be improved in usability.

APPLICATION EXAMPLE 2

In the pulse generation circuit of the application example 2 according to the pulse generation circuit of the application example 1, the start signal control circuit is configured including an inverter adapted to invert in logic and output one of two start signals having logic inverted from each other and substantially identical transition timing, and a switching circuit adapted to select one of the other of the two start signals and the output of the inverter.

In the pulse generation circuit of the application example 2, the delay elements composing the inverter delay circuit can be used as the inverter. Thus, the two signal having the same amount of delay as that of the inverter delay circuit and the same polarity can be obtained. By using the signals for the start signal control circuit of the pulse generation circuit of the application example 1, the pulse having an accurate pulse waveform can be generated.

APPLICATION EXAMPLE 3

A pulse generation circuit according to the application example 3 is a pulse generation circuit adapted to output pulses with predetermined shapes to first and second output terminals in a balanced manner in response to a start signal, including a delay circuit composed of a plurality of stages of delay circuits connected in series, each adapted to form two delayed signals with a predetermined amount of delay from the start signal, having logics reversed to each other, and transition timing substantially identical to each other, a first switching circuit adapted to connect a first output terminal to a first voltage V1 when a logical product of an output Di (i denotes an even number in a predetermined range) of an ith stage and an output XDi−1 of an i−1th stage of the delay circuit is true, and to connect the first output terminal to a second voltage V2 when a logical sum of the output Di of the ith stage and an output XDi+1 of an i+1th stage of the delay circuit is false, a second switching circuit adapted to connect the second output terminal to the first voltage V1 when a logical product of the output Di of the ith stage and the output XDi+1 of the i+1th stage of the delay circuit is true, and to connect the second output terminal to the second voltage V2 when a logical sum of the output XDi+1 of the i+1th stage and an output Di+2 of an i+2th stage of the delay circuit is false, a third switching circuit adapted to connect the first output terminal to the first voltage V1 when a logical product of the output XDi of the ith stage and the output Di−1 of the i−1th stage of the delay circuit is true, and to connect the first output terminal to the second voltage V2 when a logical sum of the output XDi of the ith stage and an output Di+1 of the i+1th stage of the delay circuit is false, and a fourth switching circuit adapted to connect the second output terminal to the first voltage V1 when a logical product of the output XDi of the ith stage and the output Di+1 of the i+1th stage of the delay circuit is true, and to connect the second output terminal to the second voltage V2 when a logical sum of the output Di+1 of the i+1th stage and an output XDi+2 of an i+2th stage of the delay circuit is false.

In the pulse generation circuit according to the application example 3, similarly to the application example 1, when the logic of the second switching circuit is changed such that the output of the inverter delay circuit is shifted one stage such as Di→XDi−1, XDi+1→Di, or Di+2→XDi+1 and inverted in logic, the resulting output matches the logic of the first switching circuit. Further, the logic of the fourth switching circuit is changed such that the output of the inverter delay circuit is shifted one stage such as XDi→Di−1, Di+1→XDi, or XDi+2→Di+1 and inverted in logic, the resulting output matches the logic of the third switching circuit. Further, the first switching circuit and the third switching circuit are the completely symmetric circuits having the logic reversed to each other, and the second switching circuit and the fourth switching circuit are the completely symmetric circuits having the logic reversed to each other. Thus, it becomes possible to obtain the pulses with a good symmetric property, an accurate waveform, and balanced outputs.

Thus, it becomes possible to generate the pulses in response to both of the rising edge and the falling edge of the start signal input to the inverter delay circuit, further since the pulses are generated every time the inverter delay circuit, which consumes most of the power consumed in the circuit, is inverted, the power consumption of the circuit per pulse generated can be reduced to a half thereof. Moreover, as described above, since the circuit has the completely symmetric connections between the inverter delay circuit and the switching circuit, no difference is caused between the pulses waveforms generated in response to the rising edge of the start signal and the pulses waveforms generated in response to the falling edge of the start signal. Further, although the pulse generated when the second switching circuit is activated is shifted from the pulse generated when the first switching circuit is activated as much as the amount of delay of each stage of the inverter delay circuit, since the shift is corrected by the start signal control circuit described above, the period from the both of the rising edge and the falling edge of the start signal to when the pulse is generated becomes constant. Thus, the pulse generation circuit according to the application example of the invention can dramatically be improved in usability.

APPLICATION EXAMPLE 4

A pulse generation circuit according to the application example 4 is a pulse generation circuit adapted to output two sets of pulses with predetermined shapes to first, second and third, fourth output terminals, respectively, in a balanced manner in response to a start signal, including a delay circuit composed of a plurality of stages of delay circuits connected in series, each adapted to form two delayed signals with a predetermined amount of delay from the start signal, having logics reversed to each other, and transition timing substantially identical to each other, a first switching circuit adapted to connect the first output terminal to a first voltage V1 when a logical product of an output D$2i$ (i denotes an even number in a predetermined range) of a 2ith stage and an output XD$2i$−2 of an 2i−2th stage of the delay circuit is true, and to connect the first output terminal to a second voltage V2 when a logical sum of the output D$2i$ of the 2ith stage and an output XD$2i$+2 of an 2i+2th stage of the delay circuit is false, a second switching circuit adapted to connect the second output terminal to the first voltage V1 when a logical product of the output D$2i$ of the 2ith stage and the output XD$2i$+2 of the 2i+2th stage of the delay circuit is true, and to connect the second output terminal to the second voltage V2 when a logical sum of the output XD$2i$+2 of the 2i+2th stage and an output D$2i$+4 of an 2i+4th stage of the delay circuit is false, a third switching circuit adapted to connect the first output terminal to the first voltage V1 when a logical product of the output XD$2i$ of the 2ith stage and the output D$2i$−2 of the 2i−2th stage of the delay circuit is true, and to connect the first output terminal to the second voltage V2 when a logical sum of the output XD$2i$ of the 2ith stage and the output D$2i$+2 of the 2i+2th stage of the delay circuit is false, a fourth switching circuit adapted to connect the second output terminal to the first voltage V1 when a logical product of the output XD$2i$ of the 2ith stage and the output D$2i$+2 of the 2i+2th stage of the delay circuit is true, and to connect the second output terminal to the second voltage V2 when a logical sum of the output D$2i$+2 of the 2i+2th stage and the output XD$2i$+4 of the 2i+4th stage of the delay circuit is false, a fifth switching circuit adapted to connect the third output terminal to the first voltage V1 when a logical product of an output D$2i$−1 of an 2i−1th stage and an output XD$2i$−3 of an 2i−3th stage of the delay circuit is true, and to connect the third output terminal to the second voltage V2 when a logical sum of an output XD$2i$−1 of the 2i−1th stage and an output D$2i$+1 of an 2i+1th stage of the delay circuit is false, a sixth switching circuit adapted to connect the fourth output terminal to the first voltage V1 when a logical product of the output D$2i$−1 of the 2i−1th stage and an output XD$2i$+1 of the 2i+1th stage of the delay circuit is true, and to connect the fourth output terminal to the second voltage V2 when a logical sum of the output D$2i$+1 of the 2i+1th stage and the output XD$2i$+3 of the 2i+3th stage of the delay circuit is false, a seventh switching circuit adapted to connect the third output terminal to the first voltage V1 when a logical product of the output XD$2i$−1 of the 2i−1th stage and the output D$2i$−3 of the 2i−3th stage of the delay circuit is true, and to connect the third output terminal to the second voltage V2 when a logical sum of the output XD$2i$−1 of the 2i−1th stage and the output D$2i$+1 of the 2i+1th stage of the delay circuit is false, and an eighth switching circuit adapted to connect the fourth output terminal to the first voltage V1 when a logical product of the output XD$2i$−1 of the 2i−1th stage and the output D$2i$+1 of the 2i+1th stage of the delay circuit is true, and to connect the fourth output terminal to the second voltage V2 when a logical sum of the output XD$2i$+1 of the 2i+1th stage and the output D$2i$+3 of the 2i+3th stage of the delay circuit is false.

In the pulse generation circuit of the application example 4, since in the pulse generation circuit of the application example 3, two sets of switching circuit are alternately connected to the same inverter delay circuit, two sets of balanced pulse outputs (IQ pulse signals) with the phases 90° different from each other can be obtained. As explained in the application example 3, since the structure having the completely symmetric connections of the switching circuit and the completely symmetric operation timing is adopted, the pulses generated are accurate. Further, since the pulses are started by the both of the rising edge and the falling edge of the start signal, the pulses can be generated every time the inverter delay circuit is inverted, thus the power consumption is efficient.

APPLICATION EXAMPLE 5

The UWB communication device according to the application example 5 is configured including the pulse generation circuit according to any one of the application examples 1 through 4.

In the UWB communication device of the application example 5, since a very thin and accurate pulse specific to UWB can easily be generated by the pulse generation circuits according to the application examples 1 through 4, by using these circuits as the template pulse generation circuit of the modulation circuit or the demodulation circuit, it becomes possible to adopt such a stable circuit mode, thus it becomes possible to compose a stable, reliable, and sensitive device at a low price. In particular, the pulse generation circuit according to the application examples of the invention is capable of generating an accurate pulse with a frequency as high as the performance limit of the component, and has high availability.

The pulse generation circuit as the embodiment of the invention can be formed of a CMOS integrated circuit or the like, and is capable of generating a pulse having an accurate waveform with a simple circuit even in the case with the pulse as thin as the operational transition duration of the component. Further, it is also possible to generate an accurate differential or IQ pulse signal with less distortion compared to the pulse generation circuit of the related art. Further, since the circuit can be formed of a logic circuit using a CMOS integrated circuit, it is possible to form a configuration capable of easily operating at the maximum speed of the CMOS circuit without increasing the operating power, thus a high-frequency wide-band pulse, which can be used for the UWB communication, can easily be generated.

BRIEF DESCRIPTION OF THE DRAWINGS

The invention will now be described with reference to the accompanying drawings, wherein like numbers reference like elements.

Although in the present specification there is explained the case of generating a waveform with the following specifications easily achievable using a complementary metal-oxide semiconductor (CMOS) process with the minimum line width of 0.18 μm as an example, the invention is not limited to this specific case.

Figure 1:
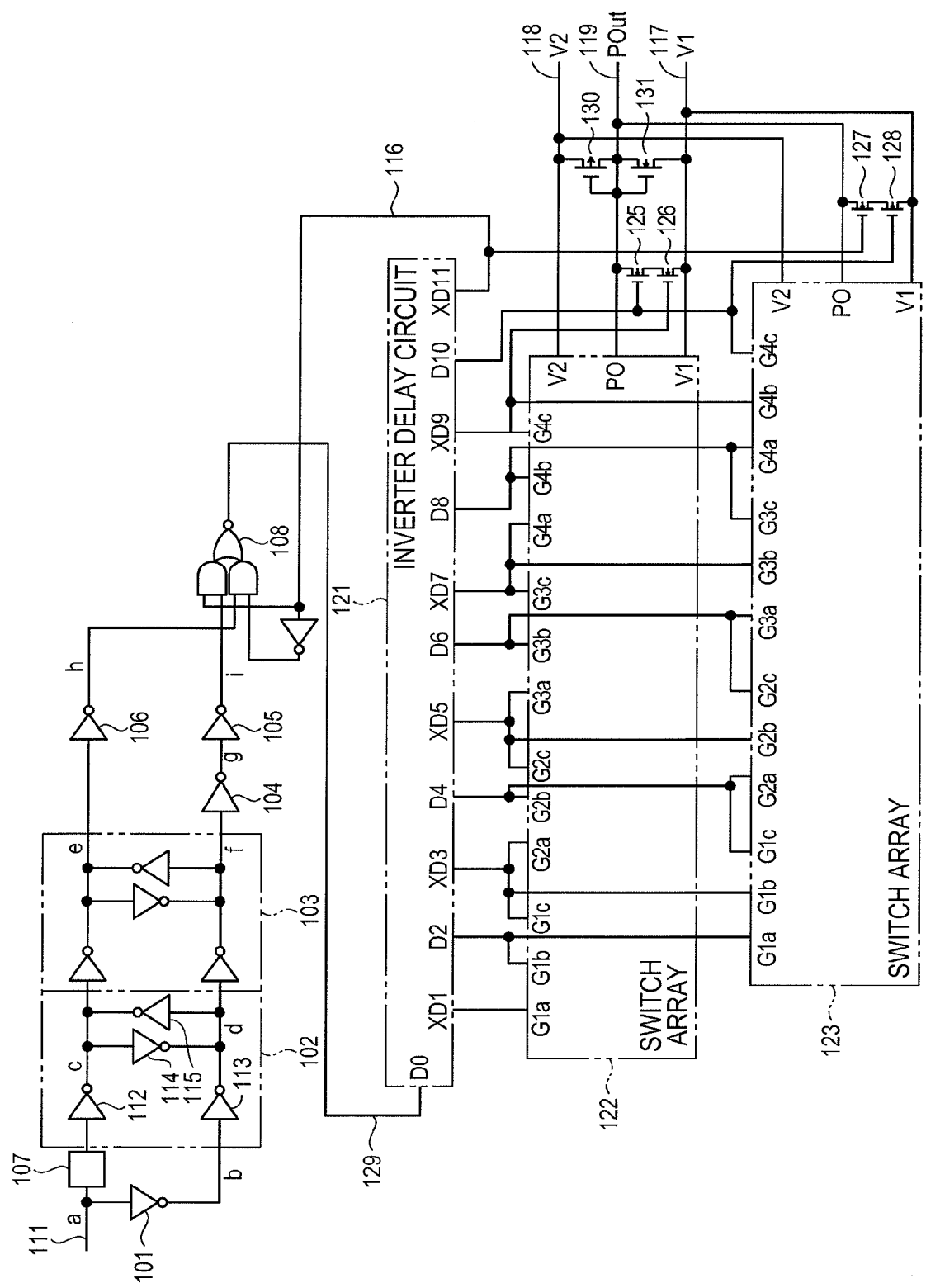
FIG. 1 is a diagram showing a pulse generation circuit of an embodiment of the invention.
Figure 2:
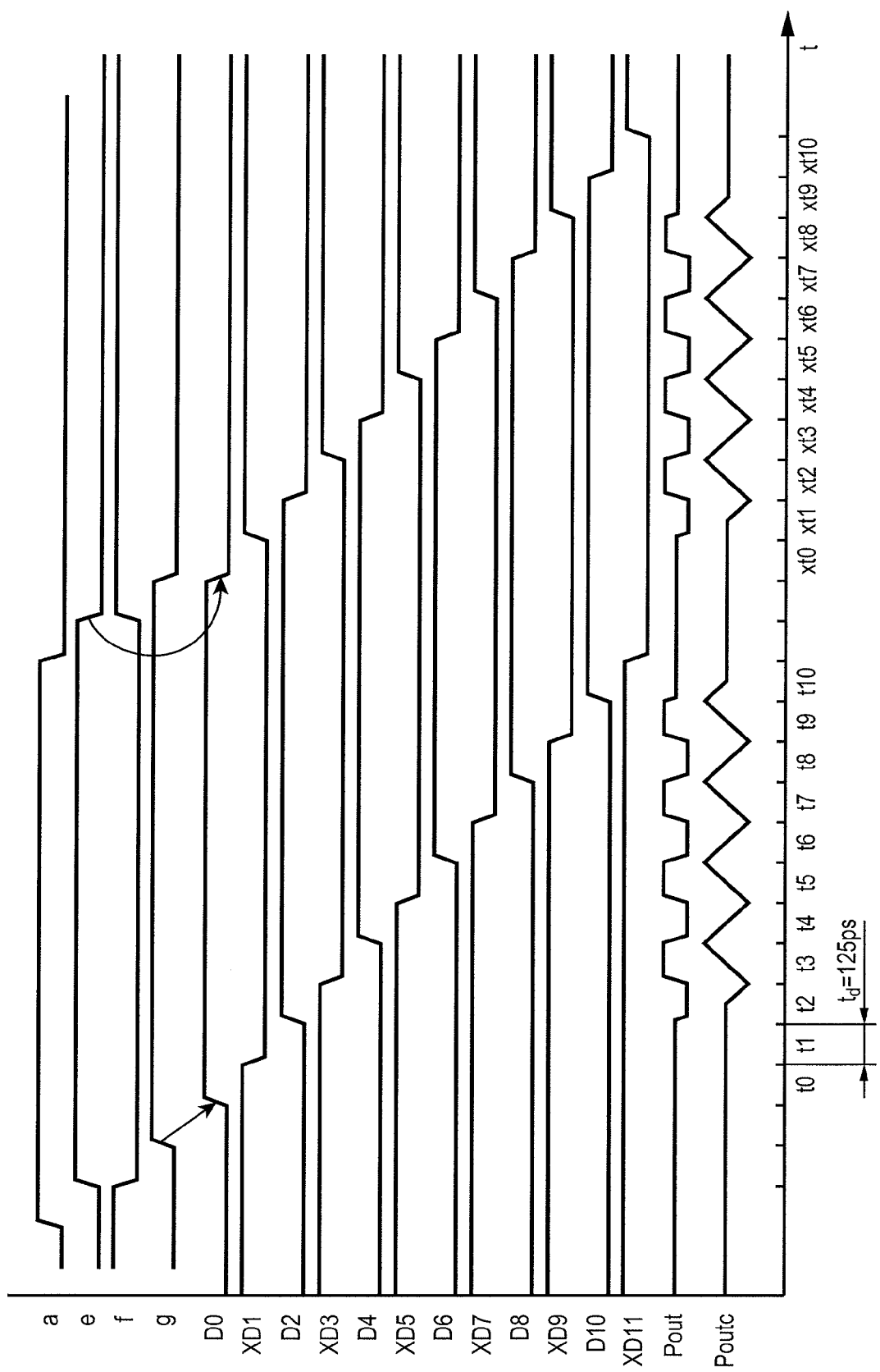
FIG. 2 is a time chart showing an operation of a pulse generation circuit of an embodiment of the invention.

Pulse interval $T_P$: arbitrary value
Carrier frequency $f_0$: 4 GHz
Carrier pulse width $P_W$: 125 psec
Pulse width $P_D$: arbitrary value
Number of pulses (number of fingers) included in period $P_D$: 4 ($P_D$=(number of fingers)×$P_W$)
Form of signals: A single-ended output, differential outputs, and a pair of IQ signals with differential outputs First Embodiment FIG. 1 shows a first embodiment of the invention. FIG. 2 describes the time chart representing the operation thereof.

The reference numeral 121 denotes an inverter delay circuit and the configuration thereof is substantially the same as the configuration of the inverter delay circuit 1105 used in the related art explained with reference to FIG. 16. It should be noted that although the 11th output XD11 is not used in the related art, it is used in the present embodiment. It is assumed that the delay amount of each stage of the inverter delay circuit is adjusted to be 125 psec. In the case in which the amount of delay takes this value, the target pulse described above, namely the pulse with the carrier frequency $f_0$=4 GHz (the carrier pulse width $P_W$=125 psec) can be generated.

Figure 16:
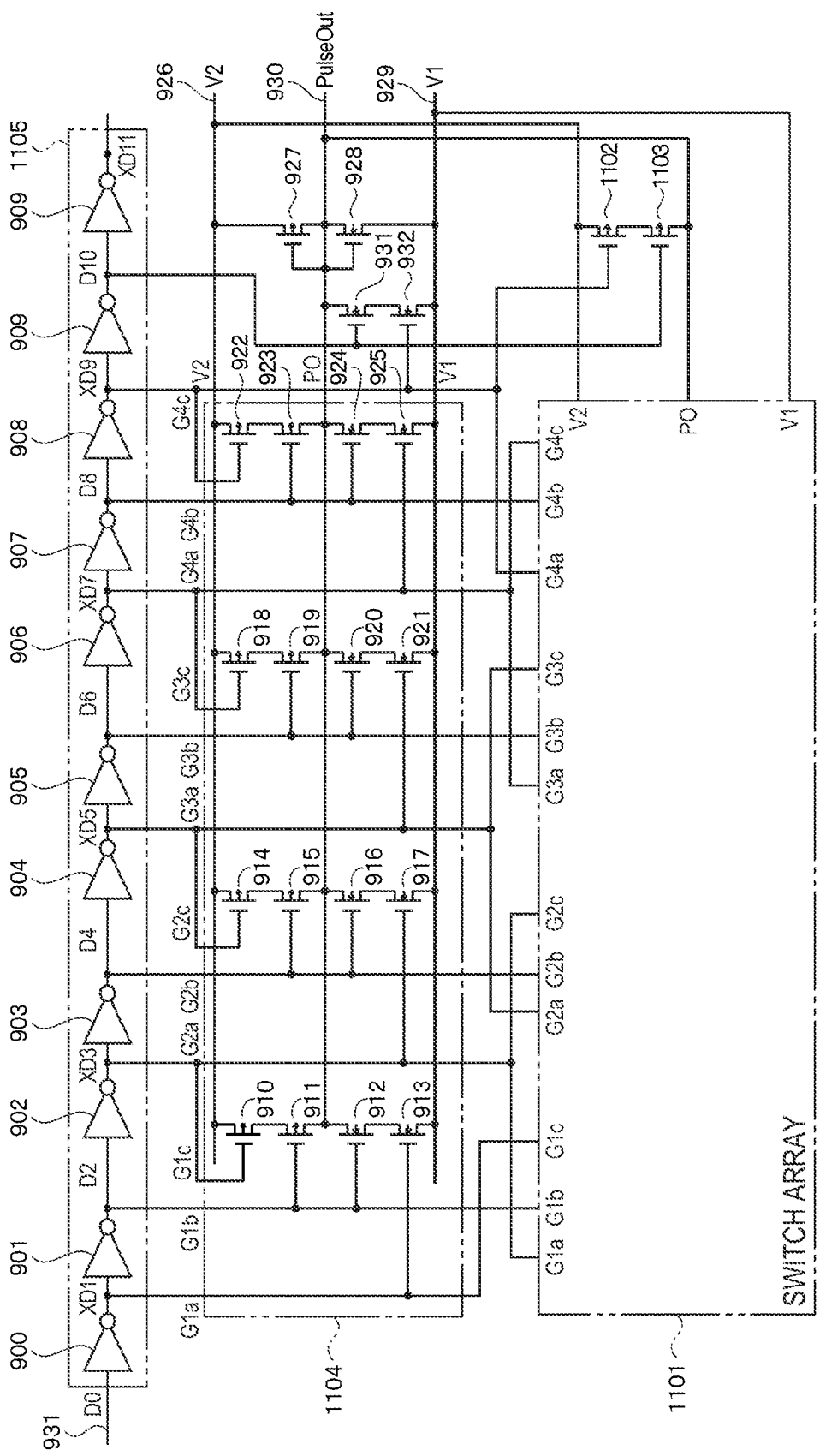
FIG. 16 is a diagram for explaining another example of a pulse generation circuit of the related art.
Figure 17:
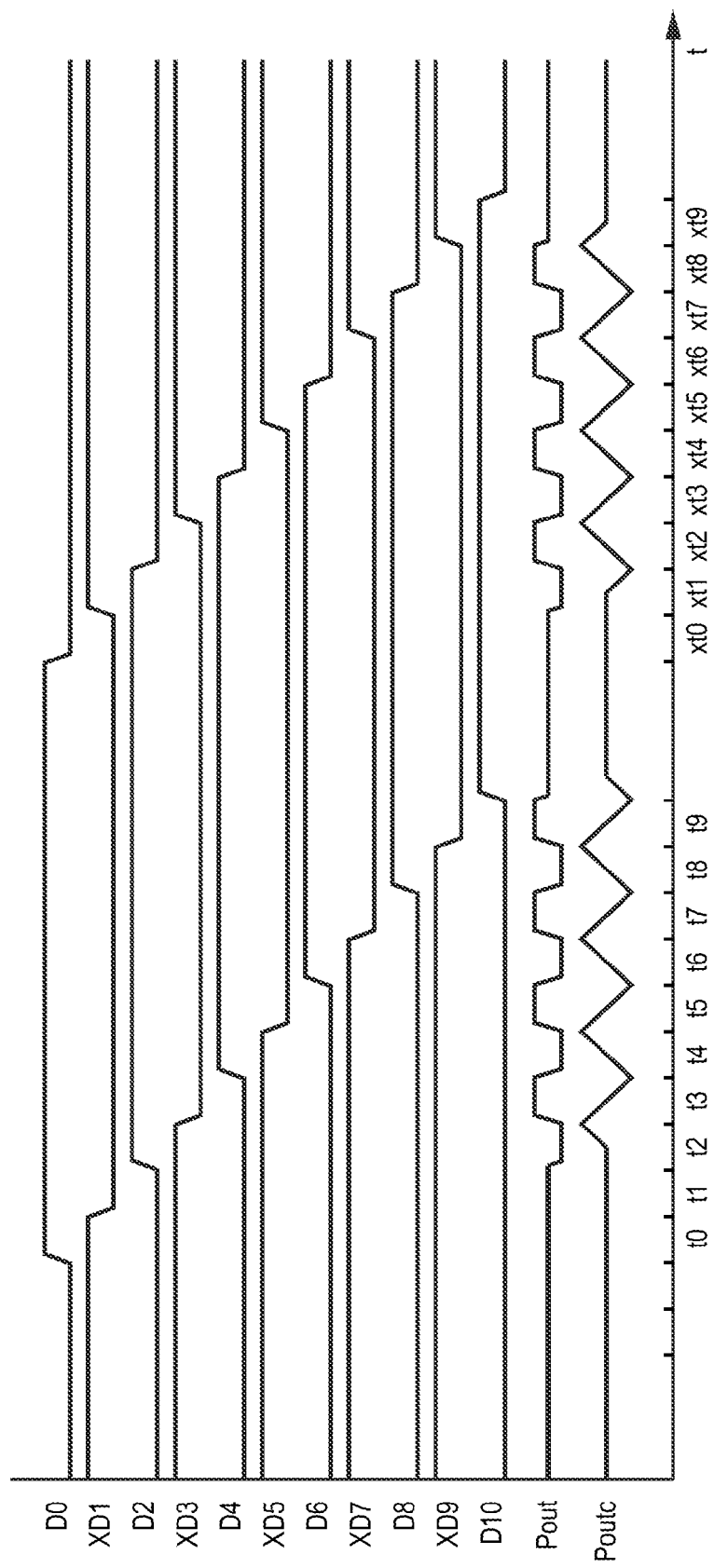
FIG. 17 is a time chart for explaining an operation of another example of a pulse generation circuit of the related art.

Further, switch arrays 122, 123 also have the same configurations as that of the switch array 1104 shown in FIG. 16. The present embodiment of the invention is different from the related art in the connection of the switch array 123, which is shown in Table 2.

TABLE 2

| | G1a | G1b | G1c | G2a | G2b | G2c | G3a | G3b | G3c | G4a | G4b | G4c |
|---|---|---|---|---|---|---|---|---|---|---|---|---|
| SWITCH ARRAY 122 | XD1 | D2 | XD3 | XD3 | D4 | XD5 | XD5 | D6 | XD7 | XD7 | D8 | XD9 |
| SWITCH ARRAY 123 | D2 | XD3 | D4 | D4 | XD5 | D6 | D6 | XD7 | D8 | D8 | XD9 | D10 |

DESCRIPTION OF EXEMPLARY EMBODIMENTS

A pulse generation circuit according to some embodiments of the invention will hereinafter be explained with reference to the accompanying drawings.

Figure 18A:
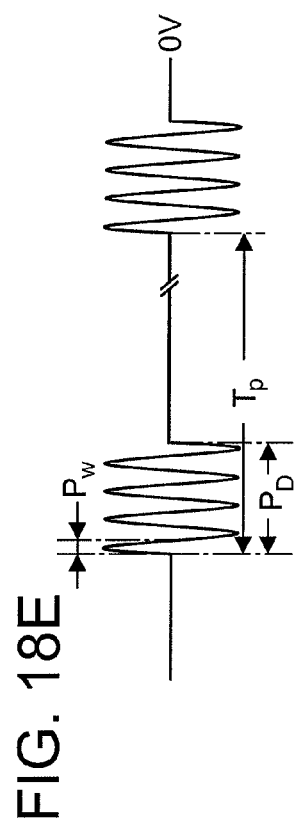
FIGS. 18A through 18G are diagrams for explaining pulses (hereinafter referred to as target pulses) the embodiments of the invention intend to generate.
Figure 18B:
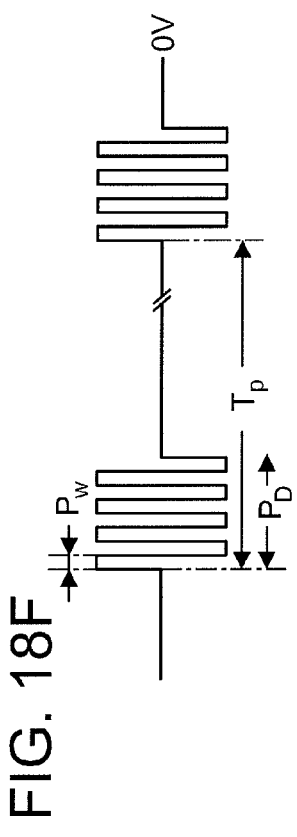
Figure 18C:
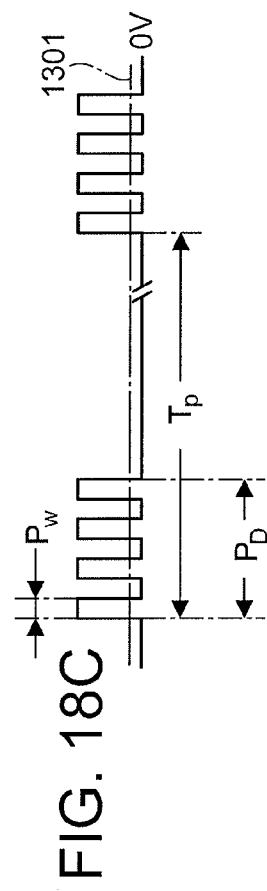
Figure 18D:
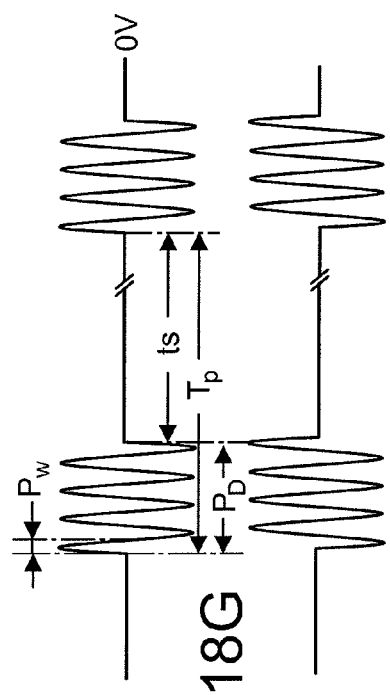
Figure 18E:
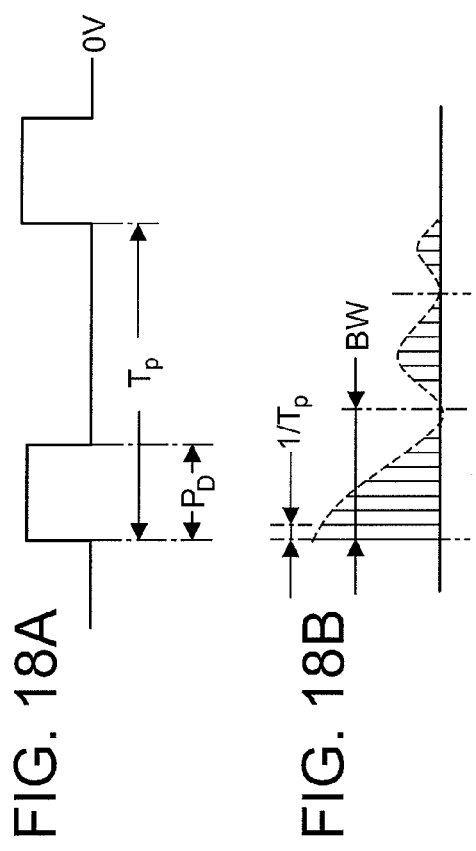
Figure 18F:
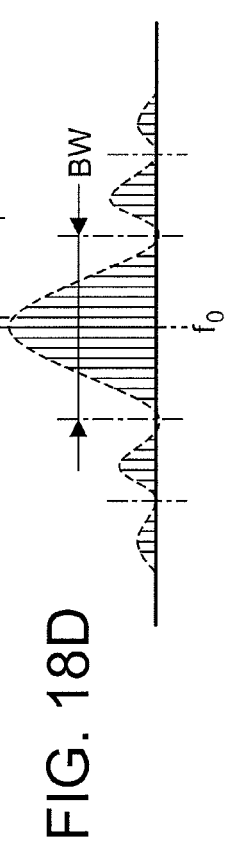
Figure 18G:
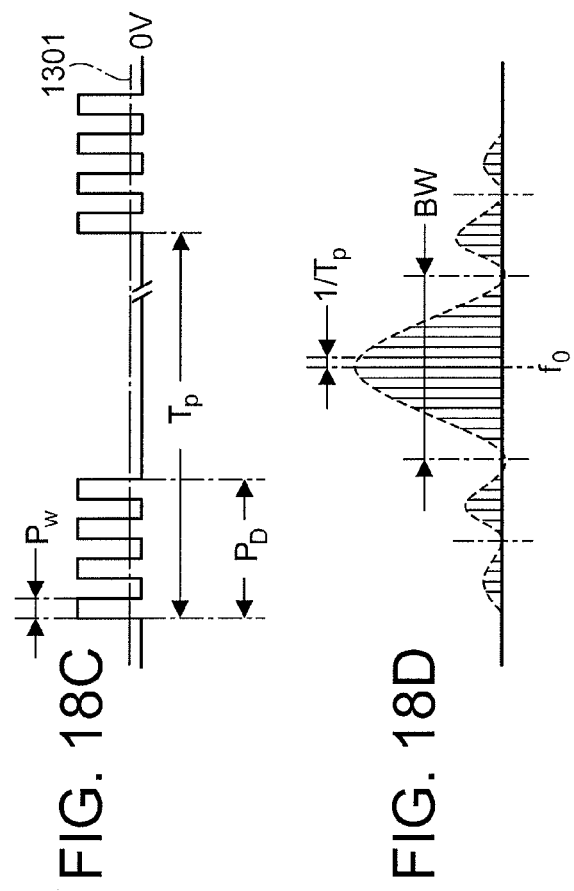

Firstly, the pulses (hereinafter referred to as target pulses) the embodiments intend to generate will be explained with reference to FIGS. 18A through 18G. The target pulses are single-ended output pulses as shown in FIGS. 18E and 18F, or pairs of pulses having phases 180 degrees different from each other as shown in FIG. 18G. Further, a method of generating signals having a phase difference of 90°, so-called IQ signals, as differential signals will also be explained. FIG. 18G shows a pulse signal with a pair of differential outputs, the potential difference of which becomes identical to the waveform shown in FIG. 18E. Focusing attention on the output potential difference as a differential signal, arbitrary value can be taken as the DC level in the period without any pulses denoted with $t_s$ in the drawing, providing the value is constant.

The pulse start signal D0 input to a terminal 129 is propagated in the delay circuit while being the delay time $t_d$ delayed and inverted in logic in every stage, and output from each of the stages as shown in XD1 through XD11 of FIG. 2. Specifically, assuming that the signal applied to the input terminal 129 is positive logic, XDi is output from the ith stage if i is an odd number, or Di is output therefrom if i is an even number. It should be noted that X represents the inverted logic of the signal, and is attached to the front of the name of the signal.

The switch array 122 and N-channel MOS transistors 125, 126 connect the pulse output terminal 119 to the first voltage level V1 when the output XDi−1 of the i−1th stage (i is an even number) and the output Di of the ith stage of the inverter delay circuits 121 are in the high level, namely, when the logical product of XDi−1 and Di is true. Then, the switch array 122 connects the pulse output terminal 119 to the second voltage level V2 when the output Di of the ith stage and the output XDi+1 of the i+1th stage of the delay circuits are in the low level, namely, when the logical product of the inverted output XDi of the output Di and the inverted-logic output Di+1 of the output XDi+1 is true.

Similarly, the switch array 123 and N-channel MOS transistors 127, 128 connect the pulse output terminal 119 to the first voltage level V1 when the output Di of the ith stage (i is an even number) and the output XDi+1 of the i+1th stage of the inverter delay 121 circuits are in the high level, namely, when the logical product of Di and XDi+1 is true. Then, the switch array 123 connects the pulse output terminal 119 to the second voltage level V2 when the output XDi+1 of the i+1th stage and the output Di+2 of the i+2th stage of the delay circuits are in the low level, namely, when the logical product of the inverted-logic output Di+1 of the output XDi+1 and the inverted output XDi+2 of the output Di+2 is true.

A P-channel MOS transistor 130 and an N-channel MOS transistor 131 are MOS resistors, which divide the first and second voltages V1, V2 to set the voltage (V0) of the output terminal 119 when switch arrays 122, 123 and the switching circuits of the MOS transistors 125 through 128 connect the output terminal 119 to neither the first voltage V1 nor the second voltage V2. Typically, the voltage is designed to have an intermediate value between the first and second voltages V1, V2 so as to keep the symmetric property of the constant of the N- and P-channel transistors.

Here, although it is possible to use the negative and positive power supply voltages VSS, VDD of the integrated circuits forming the circuit respectively as the first and second voltage levels, it is also possible to set other arbitrary voltages as the first and second voltages.

By the operation as described above, the switch array 122 and the transistors 125, 126 generate the pulse train in the periods xt0 through xt10 shown in FIG. 2 in response to a falling edge of the signal D0. Further, the switch array 123 and the transistors 127, 128 generate the pulse train in the periods t0 through t10 shown in FIG. 2 in response to a rising edge of the signal D0. The pulse output is obtained by combining the both, and is illustrated in FIG. 2 as Pout. It should be noted that the Pout is output with the waveform, illustrated as Poutc, integrated by a capacitive load in the case with the high-speed pulses as actually used for the UWB if the switching speed of the switch arrays 122, 123 and the transistors 125 through 128 is sufficiently high.

If the terminal names Di (i is an even number satisfying $2 \leq i \leq 10$) and XDi+1 of the inverter delay circuits 121 connected to the switch array 123 are replaced with XDi−1 and D1, respectively, the connection becomes identical to the connection between the switch array 122 and the inverter delay circuit 121. In other words, the switch array 123 and the transistors 127, 128 are driven in completely the same order and with completely the same waveforms as those for the switch array 122 and the transistors 125, 126. In the both case, the G1a firstly changes from the L level to the H level, and subsequently, the G1b changes from the H level to the L level and the G1c changes from the L level to the H level. Similarly, on and after the G2a, the order of changes in the signals driven there is completely the same. It should be noted that the both circuits have a temporal difference in the operational timing corresponding to the delay $t_d$ of one stage of the inverter circuit measured from the edge of the signal D0. In other words, the switch array 121 generates the signal $t_d$ delayed from a falling edge of the signal D0 while the switch array 123 generates the signal $2t_d$ delayed from a rising edge of the signal D0.

Therefore, the pulse outputs generated by the both switch arrays are output as completely the same waveforms since they are driven with completely the same timing although having the timing difference of $t_d$. In the case in which these switching elements and the inverter delay circuits are integrated on at least the same semiconductor substrate, the element variation can be suppressed to the minimum, and it becomes possible to output practically the same waveforms with a good symmetric property.

The temporal difference $t_d$ can be compensated as follows. Specifically, it is arranged that the pulses are generated $2t_d$ delayed from both of the edges, the rising edge and the falling edge, using the signal $t_d$ delayed from the start signal only in the falling edge as the signal D0. In order for delaying the start signal as much as $t_d$, it is possible to insert one stage of delay circuit element identical to the inverter forming the inverter delay circuit 121. However, in this case, since the logic is inverted, such a circuit cannot be realized without modifications. However, by taking the following configuration, such a circuit can be realized. FIGS. 1 and 2 also illustrate a configuration method of the start-up circuit, which will hereinafter be explained.

Firstly, a pair of signals e, f having transitions synchronized to each other and the logic inverted from each other are generated from the start signal a, and then one stage of delay circuit element composing the inverter delay circuit is connected to one signal f out of the pair of signals, thus a pair of signals e, g having the same logic and the temporal difference $t_d$ therebetween can be created (hereinabove, see FIG. 2). It is possible to select the signal g in the rising edges, or the signal e in the falling edges to be adopted as the input signal of the D0.

FIG. 1 shows a specific example of the circuit, and an inverter 101 generates an inverted signal of the start signal a input to a terminal 111. Further, a delay circuit is a delay buffer circuit not inverting the start signal a. It is designed that the inverter 101 and the delay buffer have the same delay amounts. Inverters 112, 113 buffer-amplify the signals to output signals c, d, respectively. Cross-coupled inverters 114, 115 are connected respectively to the outputs of the inverters 112, 113 to correct a slight difference in the delay amount between the inverter 101 and the delay buffer circuit 107 described above so that the transitions of the signals c, d are synchronized. In order for minimizing the difference in timing, a buffer circuit 103 including cross-coupled inverter, which is the same as what is described above, is further connected, thus creating the signals e, f changing completely simultaneously to each other. One stage of inverter delay element 104 having the same characteristic as the delay element composing the inverter delay circuit 121 is inserted in the signal f to create a pair of signals e and g, the signal g having the same polarity as the signal e and a temporal difference $t_d$ from the signal e. Inverter circuits 106, 105 are buffer circuits inserted so that the inverter delay element 104 is driven in the same load condition as that of each of the delay elements of the inverter delay circuit 121 in order for assuring that the inverter delay element 104 has the delay amount $t_d$ of one stage of the inverter delay circuit 121. The output signals h, i of these inverter circuits are a pair of signals having the temporal difference $t_d$ and the same polarity similarly to the signals e, g.

A selector 108 selects the signal i when the start signal a changes from the L level to the H level or the signal h when it changes from the H level to the L level to input the signal thus selected to the start signal terminal 129 as the signal D0 of the inverter delay circuit 121. Although the selection control terminal 116 of the selector 108 takes the signal from the XD11 in FIG. 1, it can take any signals capable of correctly switching between the rising edges and the falling edges such as XD1 through D10. Although connections are somewhat different depending on whether it is the positive logic or the negative logic, since it is obvious from the related art, the explanation therefor will be omitted.

To summarize the above, the pulse generation circuit according to the present embodiment of the invention is a pulse generation circuit for outputting a pulse with a predetermined shape to an output terminal in response to the start signal, characterized in having an inverter delay circuit including an inverter train having a plurality of stages of inverters connected in series and each executing logic inversion on the start signal with a predetermined amount of delay, a first switching circuit adapted to connect the output terminal to a first voltage V1 when a logical product of an output Di (i denotes an even number in a predetermined range) of an ith stage and an output XDi−1 of an i−1th stage of the inverter delay circuit is true, and to connect the output terminal to a second voltage V2 when a logical sum of the output Di of the ith stage and an output XDi+1 of an i+1th stage of the inverter delay circuit is false, a second switching circuit adapted to connect the output terminal to the first voltage V1 when a logical product of the output Di of an ith stage and the output XDi+1 of the i+1th stage of the inverter delay circuit is true, and to connect the output terminal to the second voltage V2 when a logical sum of the output XDi+1 of the i+1th stage and an output Di+2 of an i+2th stage of the inverter delay circuit is false, and a start signal control circuit adapted to input the start signal to the inverter delay circuit with a delay equal to an amount of delay of every stage of the inverter delay circuit when the first switching circuit is activated, and to input the start signal to the inverter delay circuit without the delay when the second switching circuit is activated.

It should be noted that although the stage numbers of the inverter delay circuit is provided sequentially from one in the explanations described above, what is important is the order and the logic values of switch changing operations, the outputs of the inverter delay circuit can be provided with the stage numbers started from an arbitrary number. Further, denotes an even number within a predetermined range corresponding to the arbitrary number. In the control of the switches, it is not required to use all of the outputs of the inverter delay circuit, and it is also possible to control the switches with a predetermined different logic in the anterior and posterior areas of the pulse.

Further, although it is also possible to take different expressions from those described above in the positive logic or the negative logic according to the Boolean-algebraic theorem, these are all equivalent, and therefore, such equivalent circuits should obviously be included in the appended claims.

As described above, according to the present embodiment, the pulse generation becomes possible every time inversion of the inverter delay circuit is caused in response to inversion of the start signal. Thus, the pulse is generated every inversion of the inverter delay circuit consuming a most part of the power consumption of the pulse generation circuit, and it becomes possible to minimize the power consumption per every pulse thus generated. Moreover, the pulses to be generated are precise, and have a preferable symmetric property even in the high-frequency band near to the operation limit of the circuit components.

Second Embodiment

Figure 3:
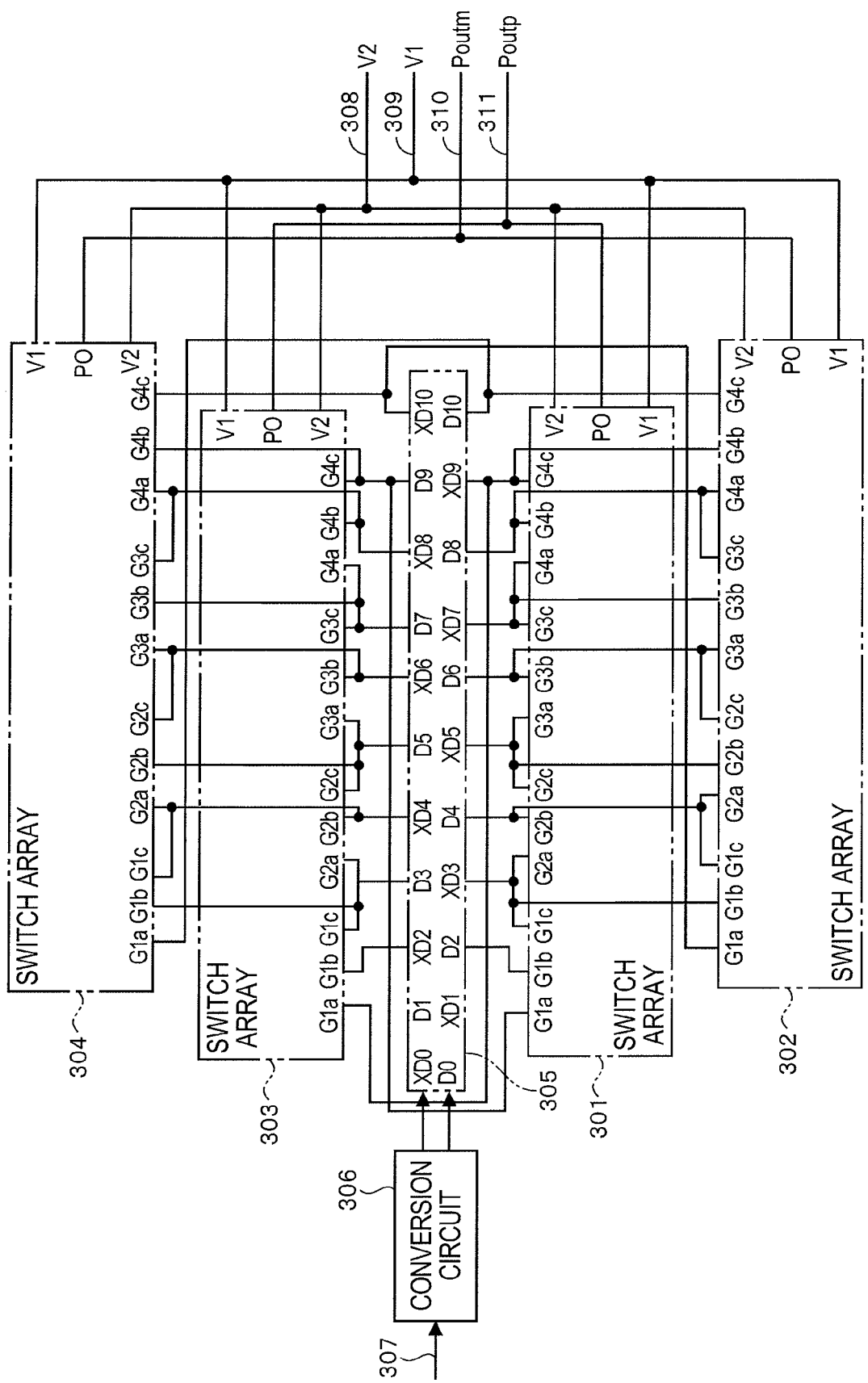
FIG. 3 is a diagram showing a pulse generation circuit of another embodiment of the invention.
Figure 4:
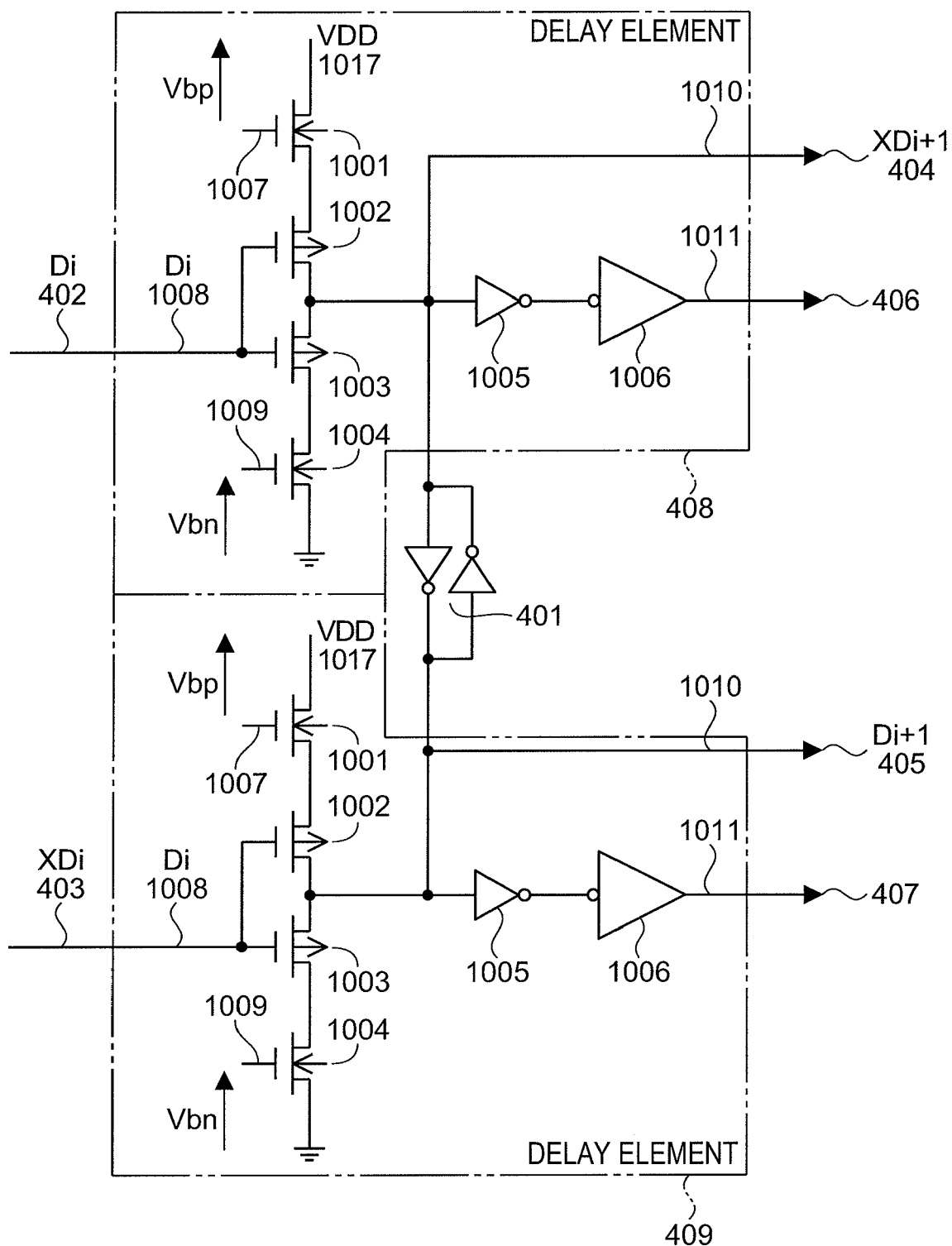
FIG. 4 is a diagram for explaining a delay circuit of every stage of inverter delay circuits of the pulse generation circuit according to the embodiment of the invention.

As a second embodiment, an example of the circuit for generating the pulse signal with differential outputs explained with reference to FIG. 18G configured based on the invention will be presented. FIG. 3 shows the circuit diagram of the circuit, and FIG. 4 shows a time chart for explaining the operation thereof.

A start signal input to a terminal 307 starts the pulse. A conversion circuit 306 is a circuit for receiving the start signal and converting it into a bi-phase signal, and the circuit from the terminal 111 to the output of the cross-coupled inverter-included buffer circuit 103 shown in FIG. 1 can be used therefor. As an output of this circuit, the bi-phase signal e, f is obtained.

Figure 15:
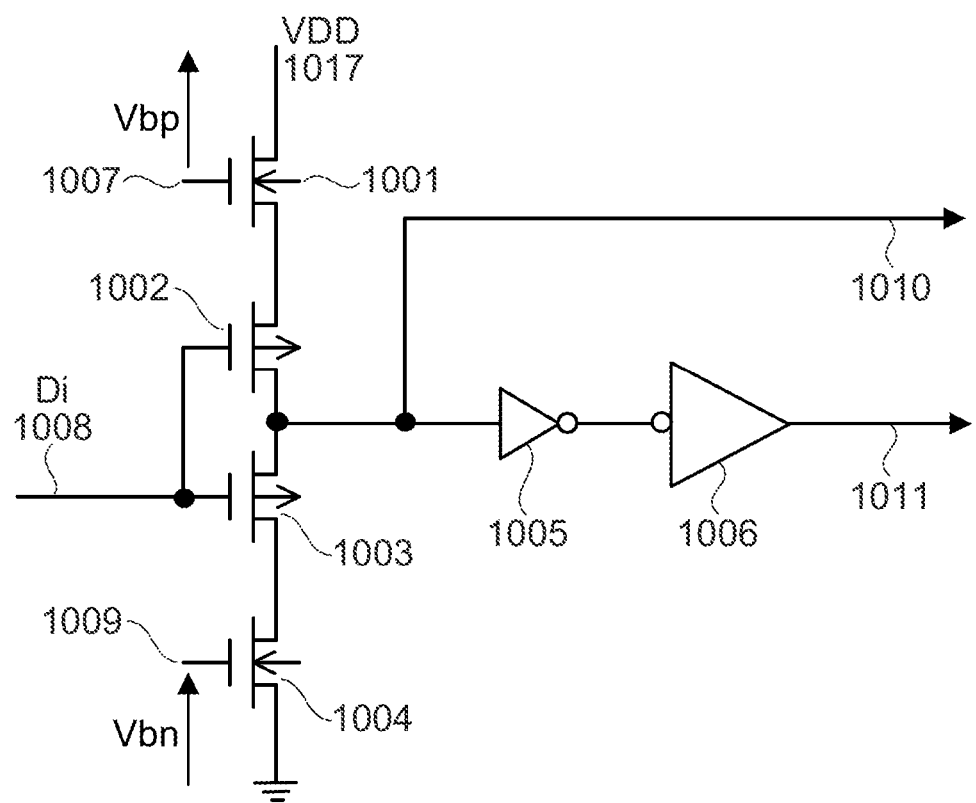
FIG. 15 is a diagram for explaining another example of a pulse generation circuit of the related art.

In response to the signal e, f, a differential inverter delay circuit 305 is started. In the differential inverter delay circuit 305, a delay element of each stage can take the circuit configuration as shown in FIG. 4. FIG. 4 is a diagram showing a configuration example of each stage of the delay circuit 305, which can be obtained by arranging delay elements 408, 409 each corresponding to the delay element of the inverter delay circuits shown in FIG. 15 in two rows, and coupling the delay elements 408, 409 with a cross-coupled inverter 401. Since individual circuits have already been explained, the individual circuits are denoted with the same reference numerals as in FIG. 15, and the explanations therefor will be omitted. The input terminals 1008 of the delay elements 408, 409 respectively become input terminals Di 402, XDi 403 in the ith stage, and are driven by signals having phases opposite to each other. The outputs 1010 thereof are connected to the delay element of the subsequent stage as XDi+1 404, Di+1 405, and at the same time, become output terminals 406, 407 of the signals each taken out therefrom with the small buffer circuit 1005, enhanced in drive capacity with the large buffer circuit 1006, and for driving the switch arrays, respectively. In the following explanations, it is assumed that the buffer circuits 1005, 1006, which cause a delay, are omitted, and that the same signal names XDi+1 and Di+1 are also used as the signal names of the signals for driving the switch arrays.

Figure 5:
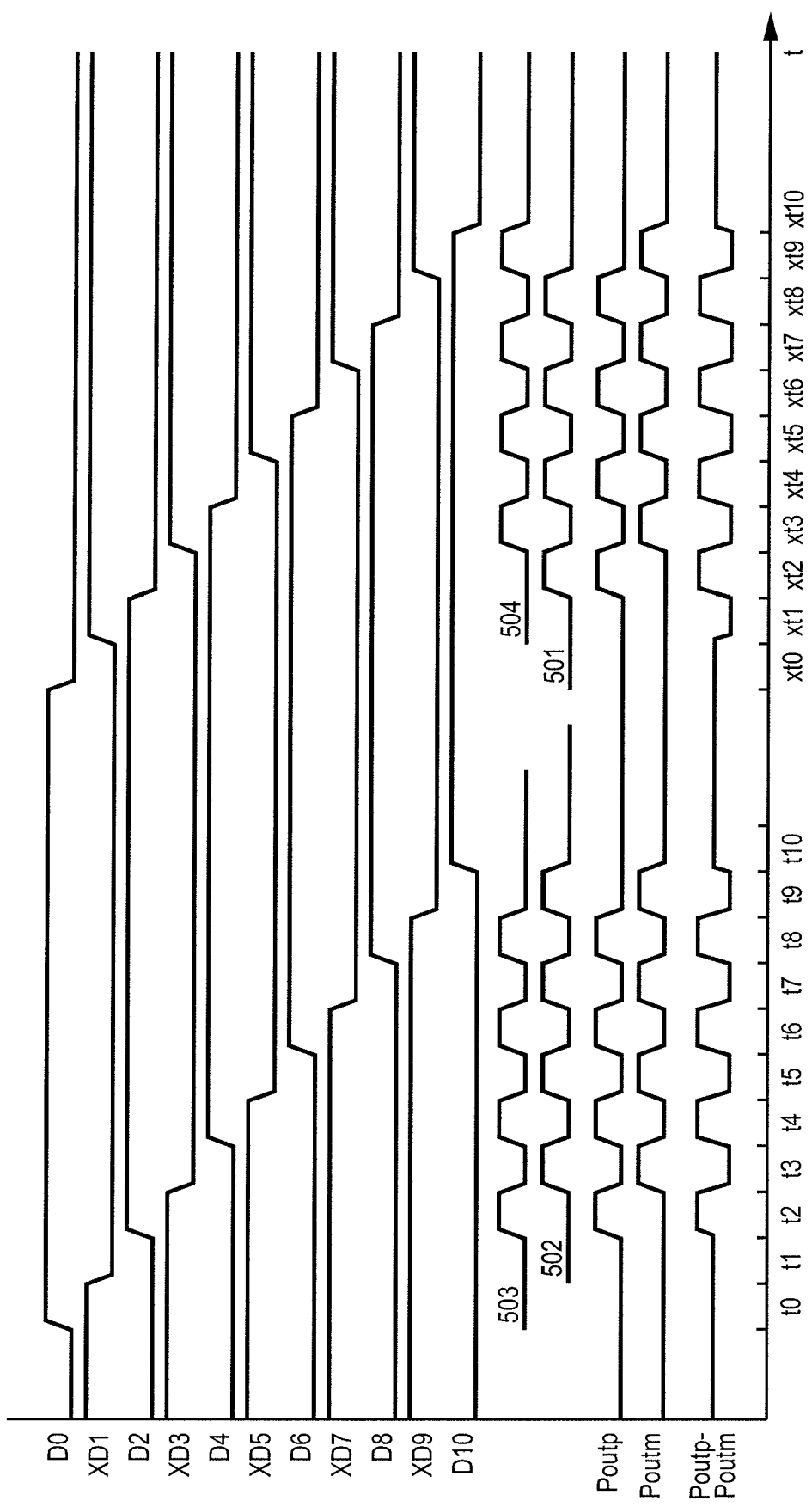
FIG. 5 is a time chart showing an operation of the pulse generation circuit of another embodiment of the invention.

When the differential inverter delay circuit 305 is simultaneously started by the circuit 306 with the signals D0, XD0 having the phases reversed to each other, ten delayed signals such as XD1, D2, . . . , D10 shown in FIG. 5 are obtained while having the delay of $t_d$ and inverted in phase, and there are also obtained further ten delayed signals D1, XD2, . . . , XD10 as the inverted signals thereof.

The reference numerals 301, 302, 303, and 304 denote switch arrays each having the same internal structure as that of the switch array 1104 shown in FIG. 16. The switch arrays are provided with the signals as shown in Table 3.

TABLE 3

| | G1a | G1b | G1c | G2a | G2b | G2c | G3a | G3b | G3c | G4a | G4b | G4c |
|---|---|---|---|---|---|---|---|---|---|---|---|---|
| SWITCH ARRAY 301 | D9 | D2 | XD3 | XD3 | D4 | XD5 | XD5 | D6 | XD7 | XD7 | D8 | XD9 |
| SWITCH ARRAY 302 | XD10 | XD3 | D4 | D4 | XD5 | D6 | D6 | XD7 | D8 | D8 | XD9 | D10 |
| SWITCH ARRAY 303 | XD9 | XD2 | D3 | D3 | XD4 | D5 | D5 | XD6 | D7 | D7 | XD8 | D9 |
| SWITCH ARRAY 304 | D10 | D3 | XD4 | XD4 | D5 | XD6 | XD6 | D7 | XD8 | XD8 | D9 | XD10 |

According to the connection shown in Table 3, the switch array 301 outputs the voltage level V1 to the pulse output terminal PO when D9 and D2 are simultaneously in the H level, namely the logical product of D9 and D2 is true (from the period t9 to the period xt1 in FIG. 5) and when the logical product of XDi−1 and Di is true, namely in the period xti−1 in FIG. 5. Here, i denotes an even number satisfying 4≦i≦8. And the switch array 301 outputs the voltage level V2 to the pulse output terminal PO when Di−2 and XDi−1 are simultaneously in the L level, namely the logical product of XDi−2 and Di−1 is true (in the period xti) (denoted with the reference numeral 501 in FIG. 5). Here, i denotes an even number satisfying 4≦i≦10.

Similarly, the switch array 302 outputs the voltage level V1 to the pulse output terminal PO when XD10 and XD3 are simultaneously in the H level, namely the logical product of XD10 and XD3 is true (from the period xt10 to the period t2 in FIG. 5) and when the logical product of Di and XDi+1 is true, namely in the period ti in FIG. 5. Here, i denotes an even number satisfying 4≦i≦8. And the switch array 302 outputs the voltage level V2 to the pulse output terminal PO when XDi−1 and Di are simultaneously in the L level, namely the logical product of Di−1 and XDi is true (in the period ti−1) (denoted with the reference numeral 502 in FIG. 5). Here, i denotes an even number satisfying 4≦i≦10.

Further, the switch array 303 outputs the voltage level V1 to the pulse output terminal PO when XD9 and XD2 are simultaneously in the H level, namely the logical product of XD9 and XD2 is true (from the period xt9 to the period t1 in FIG. 5) and when the logical product of Di−1 and XDi is true, namely in the period ti−1 in FIG. 5. Here, i denotes an even number satisfying 4≦i≦8. And the switch array 303 outputs the voltage level V2 to the pulse output terminal PO when XDi−2 and Di−1 are simultaneously in the L level, namely the logical product of Di−2 and XDi−1 is true (in the period ti−2) (denoted with the reference numeral 503 in FIG. 5). Here, i denotes an even number satisfying 4≦i≦10.

Further, the switch array 304 outputs the voltage level V1 to the pulse output terminal PO when D10 and D3 are simultaneously in the H level, namely the logical product of D10 and D3 is true (from the period t10 to the period xt2 in FIG. 5) and when the logical product of XDi and Di+1 is true, namely in the period xti in FIG. 5. Here, i denotes an even number satisfying 4≦i≦8. And the switch array 304 outputs the voltage level V2 to the pulse output terminal PO when Di−1 and XDi are simultaneously in the L level, namely the logical product of XDi−1 and Di is true (in the period xti−1) (denoted with the reference numeral 504 in FIG. 5). Here, i denotes an even number satisfying 4≦i≦10.

Further, the output PO of the switch array 301 and the output PO of the switch array 303 are connected in a wired-OR manner to provide a pulse output terminal Poutp 311 of one of the differential outputs, and the output PO of the switch array 302 and the output PO of the switch array 304 are connected in a wired-OR manner to provide a pulse output terminal Poutm 310 of the other of the differential outputs.

In the case of adopting the connections described above, the switch array 301 for generating the pulse train in response to a falling edge of D0 (in the periods xt2 through xt8) and the switch array 303 for generating the pulse train in response to a falling edge of XD0 (in the periods t2 through t8) are completely symmetric from a viewpoint of circuit. Further, the switch array 304 for generating the pulse train in response to the falling edge of D0 (in the periods xt3 through xt9) and the switch array 302 for generating the pulse train in response to the falling edge of XD0 (in the periods t3 through t9) are also completely symmetric from a viewpoint of circuit. In other words, if the terminal names XDi of the inverter delay circuit 305 are counterchanged with Di (i denotes an integer satisfying 0≦i≦10) in FIG. 3, the inverter delay circuit is identical to the original circuit. Therefore, the switch arrays 301 and 303 or the switch arrays 302 and 304 generate completely the same pulse waveforms in response to a rising edge or a falling edge of D0, XD0. By forming the circuits carefully on at least the same semiconductor substrate with a pattern layout having good symmetry, the pulses generated by the respective circuits become to have the substantially the same waveform with a good symmetric property. Further, the connection of the switch array 302 or the switch array 304 becomes identical to the connection of the switch array 301 or the switch array 303 by changing the terminal names of the inverter delay circuit connected thereto from Di to XDi−1 or from XDi to Di−1, which forms substantially the same circuit topology. Therefore, similarly to the first embodiment, substantially the same pulses with good symmetric property can be generated although the pulse waveforms generated by these circuits are shifted by $t_d$ in the generation time.

By connecting the output PO of the switch array 301 and the output PO of the switch array 303 in a wired-OR manner to provide a pulse output terminal Poutp 311 of one of the differential outputs, and connecting the output PO of the switch array 302 and the output PO of the switch array 304 in a wired-OR manner to provide a pulse output terminal Poutm 310 of the other of the differential outputs, the difference between these terminals Poutp−Poutm becomes a pulse with a good symmetric property as shown in FIG. 5. It should be noted that although the pulse output waveform considering the load capacitance is omitted in the drawing, it is conceivable that the symmetry is obviously maintained even in the case in which a heavy capacitive load is connected thereto.

In the present embodiment, the transistors 130, 131 for determining the intermediate level used in the first embodiment can be eliminated, and therefore, the leakage current caused by this part can be eliminated, thus reduction of the power consumption becomes possible. Further, since the switching elements preferably driven in a period a half of $t_d$ such as the transistors 125, 126, 127, and 128 are not included, the circuit design becomes easier. Further, although the eleven stages of inverter delay elements are required in the first embodiment, the nine stages are enough for the present embodiment, thus the number of elements used therein can slightly be reduced (It should be noted that the outputs D1, XD1 of the first stage are not used. The first stage can be eliminated).

To summarize the above, the pulse generation circuit according to the present embodiment of the invention is a pulse generation circuit adapted to output pulses with predetermined shapes to first and second output terminals in a balanced manner in response to a start signal, configured to include a delay circuit composed of a plurality of stages of delay circuits connected in series, each adapted to form two delayed signals with a predetermined amount of delay from the start signal, having logics reversed to each other, and transition timing substantially identical to each other, a first switching circuit adapted to connect the first output terminal to a first voltage V1 when a logical product of an output Di (i denotes an even number in a predetermined range) of an ith stage and an output XDi−1 of an i−1th stage of the delay circuit is true, and to connect the first output terminal to a second voltage V2 when a logical sum of the output Di of the ith stage and an output XDi+1 of an i+1th stage of the delay circuit is false, a second switching circuit adapted to connect the second output terminal to the first voltage V1 when a logical product of the output Di of an ith stage and the output XDi+1 of the i+1th stage of the delay circuit is true, and to connect the second output terminal to the second voltage V2 when a logical sum of the output XDi+1 of the i+1th stage and an output Di+2 of an i+2th stage of the delay circuit is false, a third switching circuit adapted to connect the first output terminal to the first voltage V1 when a logical product of the output XDi of the ith stage and the output Di−1 of the i−1th stage of the delay circuit is true, and to connect the first output terminal to the second voltage V2 when a logical sum of the output XDi of the ith stage and an output Di+1 of the i+1th stage of the delay circuit is false, a fourth switching circuit adapted to connect the second output terminal to the first voltage V1 when a logical product of the output XDi of the ith stage and the output Di+1 of the i+1th stage of the delay circuit is true, and to connect the second output terminal to the second voltage V2 when a logical sum of the output Di+1 of the i+1th stage and the output XDi+2 of the i+2th stage of the delay circuit is false.

It should be noted that although the stage numbers of the inverter delay circuit is provided sequentially from one in the explanations described above, what is important is the order and the logic values of switch changing operations, the outputs of the inverter delay circuit can be provided with the stage numbers started from an arbitrary number. Further, i denotes an even number within a predetermined range corresponding to the arbitrary number. Therefore, although the explanation in the above paragraphs seems to be different from the explanation in the last paragraph, they are the same in the order of switching, and consistent with each other. In the control of the switches, it is not required to use all of the outputs of the inverter delay circuit, and it is also possible to control the switches with a predetermined different logic in the anterior and posterior areas of the pulse.

Further, although it is also possible to take different expressions from those described above in the positive logic or the negative logic according to the Boolean-algebraic theorem, these are all equivalent, and therefore, such equivalent circuits should obviously be included in the appended claims.

As described above, according to the present embodiment, the pulse generation becomes possible every time inversion of the inverter delay circuit is caused in response to inversion of the start signal. Thus, the pulse is generated every inversion of the inverter delay circuit consuming a most part of the power consumption of the pulse generation circuit, and it becomes possible to minimize the power consumption per every pulse thus generated. Moreover, the differential pulses to be generated are precise, and have a preferable symmetric property even in the high-frequency band near to the operation limit of the circuit components.

Third Embodiment

Figure 6:
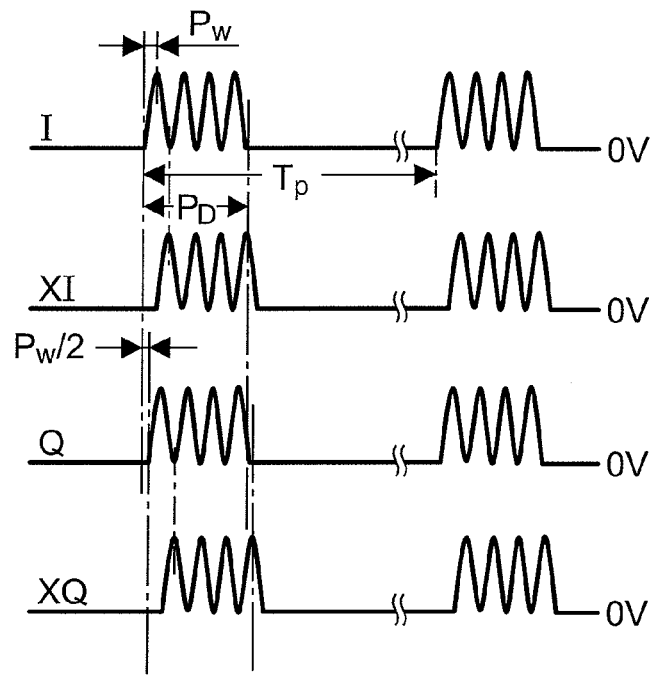
FIG. 6 is a diagram showing pulses generated in a pulse generation circuit of still another embodiment of the invention.

The so-called IQ pulse signal having the phase 90° shifted from each other as shown in FIG. 6 is used as a template signal in the synchronous detection of a UWB receiver, and the generation method thereof is a problem to be solved. In the third embodiment, the circuit for generating the IQ pulse signal having phases 90° different from each other will be explained. Although the explanations will be presented exemplifying the case in which the specifications of the pulses to be generated are the same as in the first and second embodiments, the invention is not limited thereto.

Signals I and XI shown in FIG. 6 are the pair of pulse signals of the differential output generated in the second embodiment. In the present embodiment, a pair of differential output signals Q, XQ 90°, namely period of $P_w/2$ delayed from the signals I, XI are generated.

In order therefor, there are created inverter delay circuit output signals Dii, Dqi, XDii, and XDqi $t_d/2$ shifted temporally from each other. and eight switch arrays SA1, SA2, . . . , SA8 are driven by these signals based on Table 4.

TABLE 4

|  | G1a | G1b | G1c | G2a | G2b | G2c | G3a | G3b | G3c | G4a | G4b | G4c |
|---|---|---|---|---|---|---|---|---|---|---|---|---|
| SWITCH ARRAY SA1 | Di9 | Di2 | XDi3 | XDi3 | Di4 | XDi5 | XDi5 | Di6 | XDi7 | XDi7 | Di8 | XDi9 |
| SWITCH ARRAY SA2 | XDi10 | XDi3 | Di4 | Di4 | XDi5 | Di6 | Di6 | XDi7 | Di8 | Di8 | XDi9 | Di10 |
| SWITCH ARRAY SA3 | XDi9 | XDi2 | Di3 | Di3 | XDi4 | Di5 | Di5 | XDi6 | Di7 | Di7 | XDi8 | Di9 |
| SWITCH ARRAY SA4 | Di10 | Di3 | XDi4 | XDi4 | Di5 | XDi6 | XDi6 | Di7 | XDi8 | XDi8 | Di9 | XDi10 |
| SWITCH ARRAY SA5 | Dq9 | Dq2 | XDq3 | XDq3 | Dq4 | XDq5 | XDq5 | Dq6 | XDq7 | XDq7 | Dq8 | XDq9 |
| SWITCH ARRAY SA6 | XDq10 | XDq3 | Dq4 | Dq4 | XDq5 | Dq6 | Dq6 | XDq7 | Dq8 | Dq8 | XDq9 | Dq10 |
| SWITCH ARRAY SA7 | XDq9 | XDq2 | Dq3 | Dq3 | XDq4 | Dq5 | Dq5 | XDq6 | Dq7 | Dq7 | XDq8 | Dq9 |
| SWITCH ARRAY SA8 | Dq10 | Dq3 | XDq4 | XDq4 | Dq5 | XDq6 | XDq6 | Dq7 | XDq8 | XDq8 | Dq9 | XDq10 |

By connecting the output PO of the switch array SA1 and the output PO of the switch array SA3 in a wired-OR manner to provide a pulse output terminal Poutip of one (I shown in FIG. 6) of the differential outputs of the I signal, and connecting the output PO of the switch array SA2 and the output PO of the switch array SA4 in a wired-OR manner to provide a pulse output terminal Poutim of the other (XI shown in FIG. 6) of the differential outputs of the I signal, the signals I, XI shown in FIG. 6 can be obtained. Further, by connecting the output PO of the switch array SA5 and the output PO of the switch array SA7 in a wired-OR manner to provide a pulse output terminal Poutqp of one (Q shown in FIG. 6) of the differential outputs of the Q signal, and connecting the output PO of the switch array SA6 and the output PO of the switch array SA8 in a wired-OR manner to provide a pulse output terminal Poutqm of the other (XQ shown in FIG. 6) of the differential outputs of the Q signal, the signals Q, XQ shown in FIG. 6 can be obtained.

As explained in the first and second embodiments, since the elements operate at a speed as high as almost the performance limit thereof, the pulses output therefrom do not have a digitalized square waveform, and the preferably rounded waveform as shown in FIG. 6 can be obtained with a simple filter or even without any filters. Further, the difference between the signals Poutip−Poutim and the difference between the signals Poutqp−Poutqm each become pulses with a preferable symmetric property as shown in FIG. 5.

Figure 7:
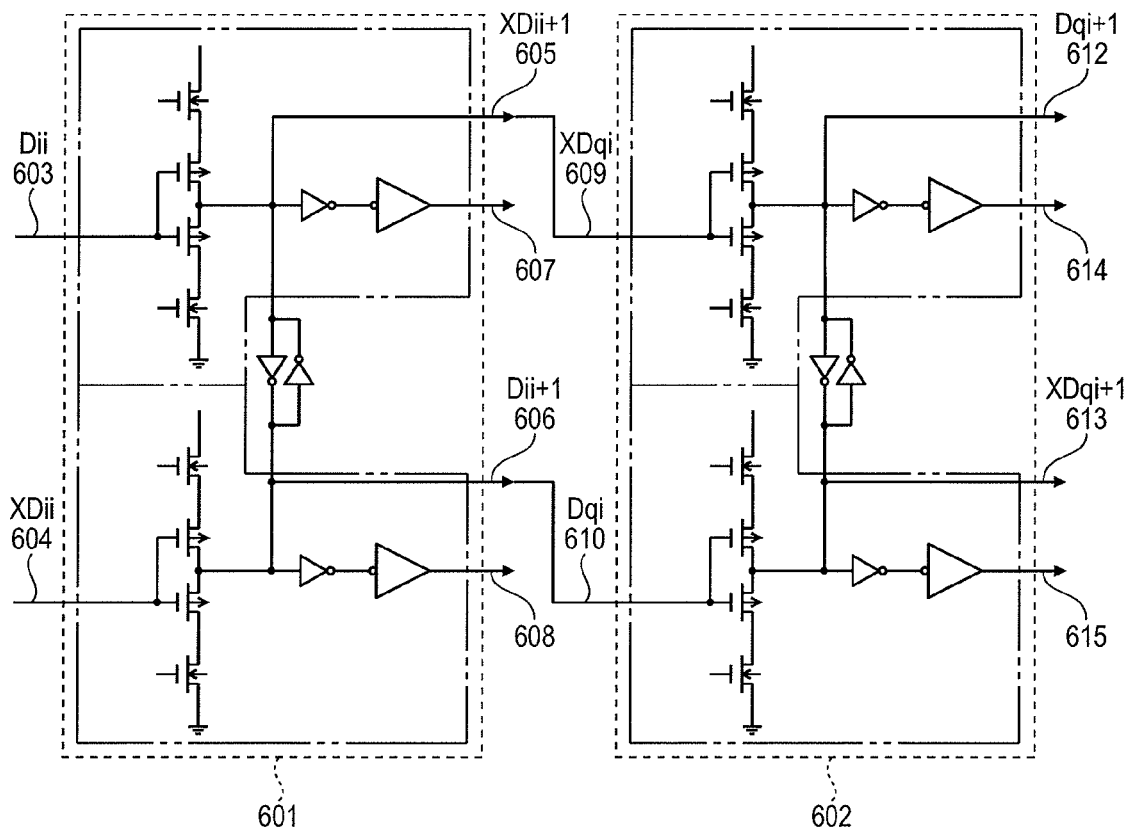
FIG. 7 is a diagram for explaining a part of an inverter delay circuit used for the pulse generation circuit of still another embodiment of the invention.

In order for generating the inverter delay circuit output signals Dii, Dqi, XDii, XDqi $t_d/2$ shifted temporally from each other, it is possible to configure the inverter delay circuit as shown in FIG. 7. FIG. 7 describes two stages of the inverter delay circuit, wherein the inverter delay circuits 601, 602 surrounded with the dashed line have the same configuration as that of the delay element forming the inverter delay circuit explained with reference to FIG. 4. It should be noted that it is assumed that the amount of delay of each delay element is adjusted to be $t_d/2$. The inputs of the delay element 601 of the ith stage are Dii 603, XDii 604. Further, the outputs thereof become a pair of XDii+1 605 and Dii+1 606. These signals also become the inputs Dqi 610, XDqi 609 of the delay element 602 in the ith stage, and the outputs thereof become a pair of signals Dqi+1 612, XDqi+1 613. Terminals 607, 608, 614, and 615 are output terminals of the signals obtained by buffer-amplifying the signals XDii+1 605, Dii+1 606, Dqi+1 612, and XDqi+1 613 in order for driving the switch arrays. By configuring the inverter delay circuit with a predetermined number of stages (10 stages (totally 20 stages of delay elements) in the present embodiment) of the pairs of delay elements connected in series, each pair of delay elements being connected as described above and each delay element having the amount of delay of $t_d/2$, the signals Dii, XDii, and the signals Dqi, XDqi ($1 \leq i \leq 10$) shifted $t_d/2$ from each other and for driving the switch arrays can be obtained.

The circuit as described above generates the pulses in response to both edges of the start pulse, and since the pulses are generated every inversion of the inverter delay circuit consuming the most part of the power consumption of the circuit, the power consumption is efficient. Further, similarly to the first and second embodiments, the operation timing and the circuit topology are completely the same, and therefore, the pulse waveforms thus generated have the same characteristics, thus the accurate pairs of pulses with a good symmetric property can be generated.

In the above description, the explanations are presented providing numbers alternately to each of the outputs for generating the I, Q signals like XDi1, XDq1, Di2, XDq2, and so on. To summarize the above changing the numbers to the serial numbers, the pulse generation circuit according to the present embodiment of the invention is a pulse generation circuit adapted to output two sets of pulses with predetermined shapes to first, second and third, fourth output terminals, respectively, in a balanced manner in response to a start signal, configured to including a delay circuit composed of a plurality of stages of delay circuits connected in series, each adapted to form two delayed signals with a predetermined amount of delay from the start signal, having logics reversed to each other, and transition timing substantially identical to each other, a first switching circuit adapted to connect the first output terminal to a first voltage V1 when a logical product of an output D2$i$ (i denotes an even number in a predetermined range) of a 2ith stage and an output XD2$i$−2 of an 2i−2th stage of the delay circuit is true, and to connect the first output terminal to a second voltage V2 when a logical sum of the output D2$i$ of the 2ith stage and an output XD2$i$+2 of an 2i+2th stage of the delay circuit is false, a second switching circuit adapted to connect the second output terminal to the first voltage V1 when a logical product of the output D2$i$ of the 2ith stage and the output XD2$i$+2 of the 2i+2th stage of the delay circuit is true, and to connect the second output terminal to the second voltage V2 when a logical sum of the output XD2$i$+2 of the 2i+2th stage and an output D2$i$+4 of an 2i+4th stage of the delay circuit is false, a third switching circuit adapted to connect the first output terminal to the first voltage V1 when a logical product of the output XD2$i$ of the 2ith stage and the output D2$i$−2 of the 2i−2th stage of the delay circuit is true, and to connect the first output terminal to the second voltage V2 when a logical sum of the output XD2$i$ of the 2ith stage and the output D2$i$+2 of the 2i+2th stage of the delay circuit is false, a fourth switching circuit adapted to connect the second output terminal to the first voltage V1 when a logical product of the output XD2$i$ of the 2ith stage and the output D2$i$+2 of the 2i+2th stage of the delay circuit is true, and to connect the second output terminal to the second voltage V2 when a logical sum of the output D2$i$+2 of the 2i+2th stage and the output XD2$i$+4 of the 2i+4th stage of the delay circuit is false, a fifth switching circuit adapted to connect the third output terminal to the first voltage V1 when a logical product of the output D2$i$−1 of an 2i−1th stage and the output XD2$i$−3 of the 2i−3th stage of the delay circuit is true, and to connect the third output terminal to the second voltage V2 when a logical sum of the output XD2$i$−1 of the 2i−1th stage and an output D2$i$+1 of an 2i+1th stage of the delay circuit is false, a sixth switching circuit adapted to connect the fourth output terminal to the first voltage V1 when a logical product of the output D2$i$−1 of the 2i−1th stage and the output XD2$i$+1 of the 2i+1th stage of the delay circuit is true, and to connect the fourth output terminal to the second voltage V2 when a logical sum of the output D2$i$+1 of the 2i+1th stage and the output XD2$i$+3 of the 2i+3th stage of the delay circuit is false, a seventh switching circuit adapted to connect the third output terminal to the first voltage V1 when a logical product of the output XD2$i$−1 of the 2i−1th stage and the output D2$i$−3 of the 2i−3th stage of the delay circuit is true, and to connect the third output terminal to the second voltage V2 when a logical sum of the output XD2$i$−1 of the 2i−1th stage and the output D2$i$+1 of the 2i+1th stage of the delay circuit is false, and an eighth switching circuit adapted to connect the fourth output terminal to the first voltage V1 when a logical product of the output XD2$i$−1 of the 2i−1th stage and the output D2$i$+1 of the 2i+1th stage of the delay circuit is true, and to connect the fourth output terminal to the second voltage V2 when a logical sum of the output XD2$i$+1 of the 2i+1th stage and the output D2$i$+3 of the 2i+3th stage of the delay circuit is false.

It should be noted that although the stage numbers of the inverter delay circuit is provided sequentially from one in the explanations described above, what is important is the order and the logic values of switch changing operations, the outputs of the inverter delay circuit can be provided with the stage numbers started from an arbitrary number. Further, denotes an even number within a predetermined range corresponding to the arbitrary number. In the control of the switches, it is not required to use all of the outputs of the inverter delay circuit, and it is also possible to control the switches with a predetermined different logic in the anterior and posterior areas of the pulse.

Further, although it is also possible to take different expressions from those described above in the positive logic or the negative logic according to the Boolean-algebraic theorem, these are all equivalent, and therefore, such equivalent circuits should obviously be included in the appended claims.

As described above, according to the present embodiment, the pulse generation becomes possible every time inversion of the inverter delay circuit is caused in response to inversion of the start signal. Thus, the pulse is generated every inversion of the inverter delay circuit consuming a most part of the power consumption of the pulse generation circuit, and it becomes possible to minimize the power consumption per every pulse thus generated. Moreover, the differential pulses to be generated are precise, and have a preferable symmetric property even in the high-frequency band near to the operation limit of the circuit components.

Fourth Embodiment

Figure 8:
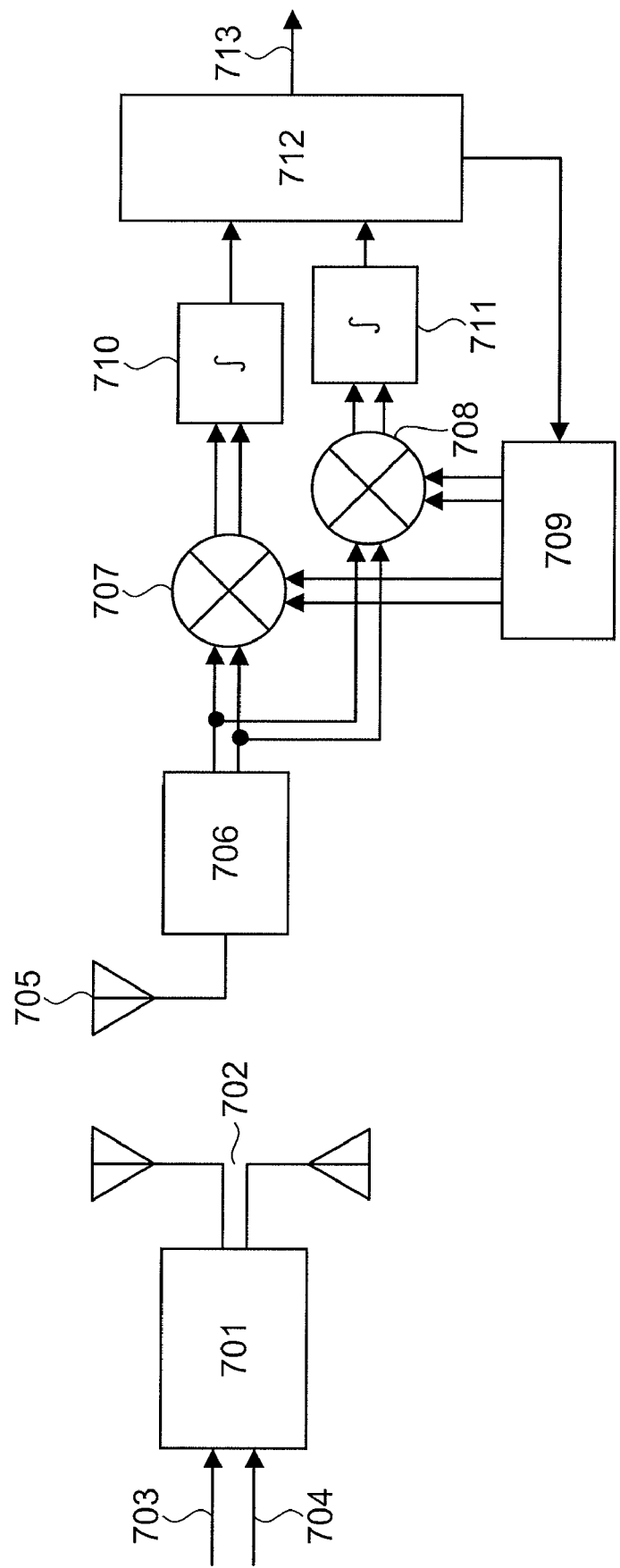
FIG. 8 is a first diagram showing a UWB communication device of an embodiment according to the invention.
Figure 9:
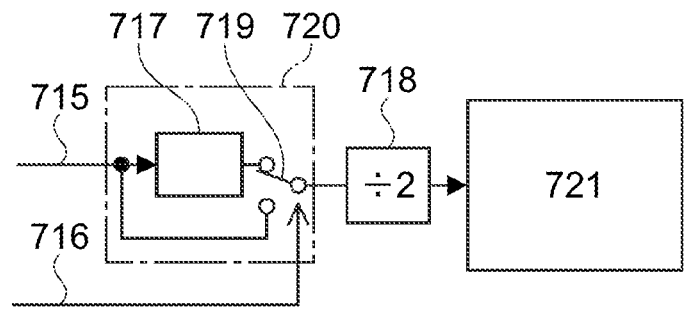
FIG. 9 is a second diagram showing the UWB communication device of the embodiment according to the invention.
Figure 10:
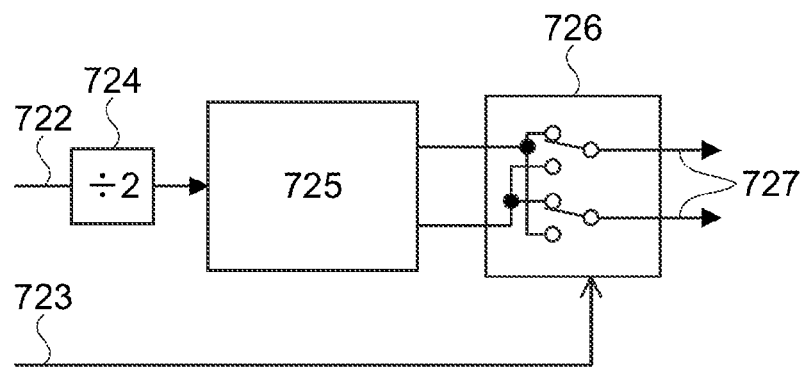
FIG. 10 is a third diagram showing the UWB communication device of the embodiment according to the invention.
Figure 11:
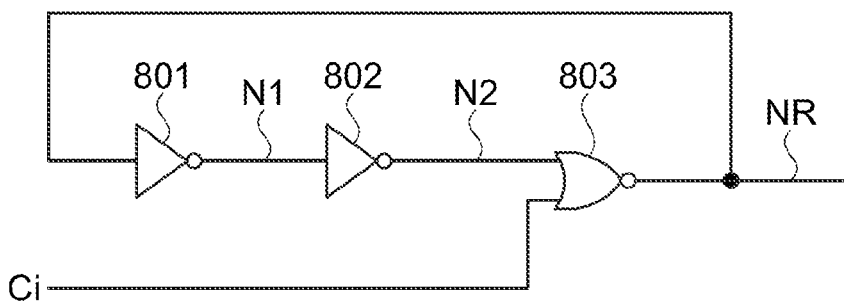
FIG. 11 is a configuration diagram of a pulse generation circuit of the related art.
Figure 12:
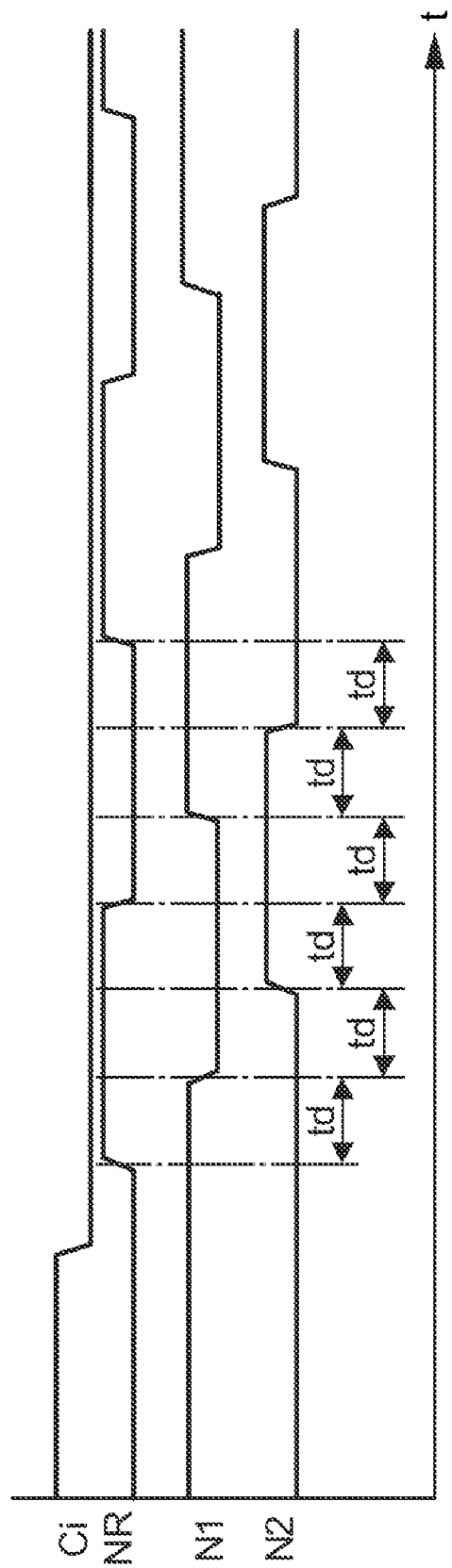
FIG. 12 is an operational time chart of the pulse generation circuit of the related art.
Figure 13:
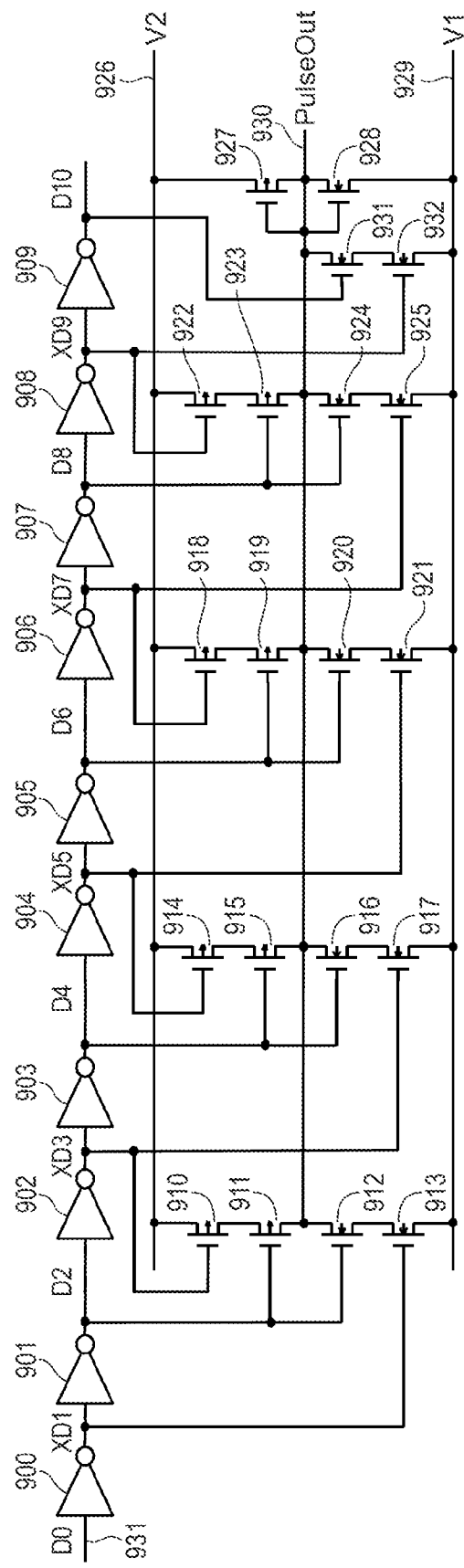
FIG. 13 is a configuration diagram of another pulse generation circuit of the related art.
Figure 14:
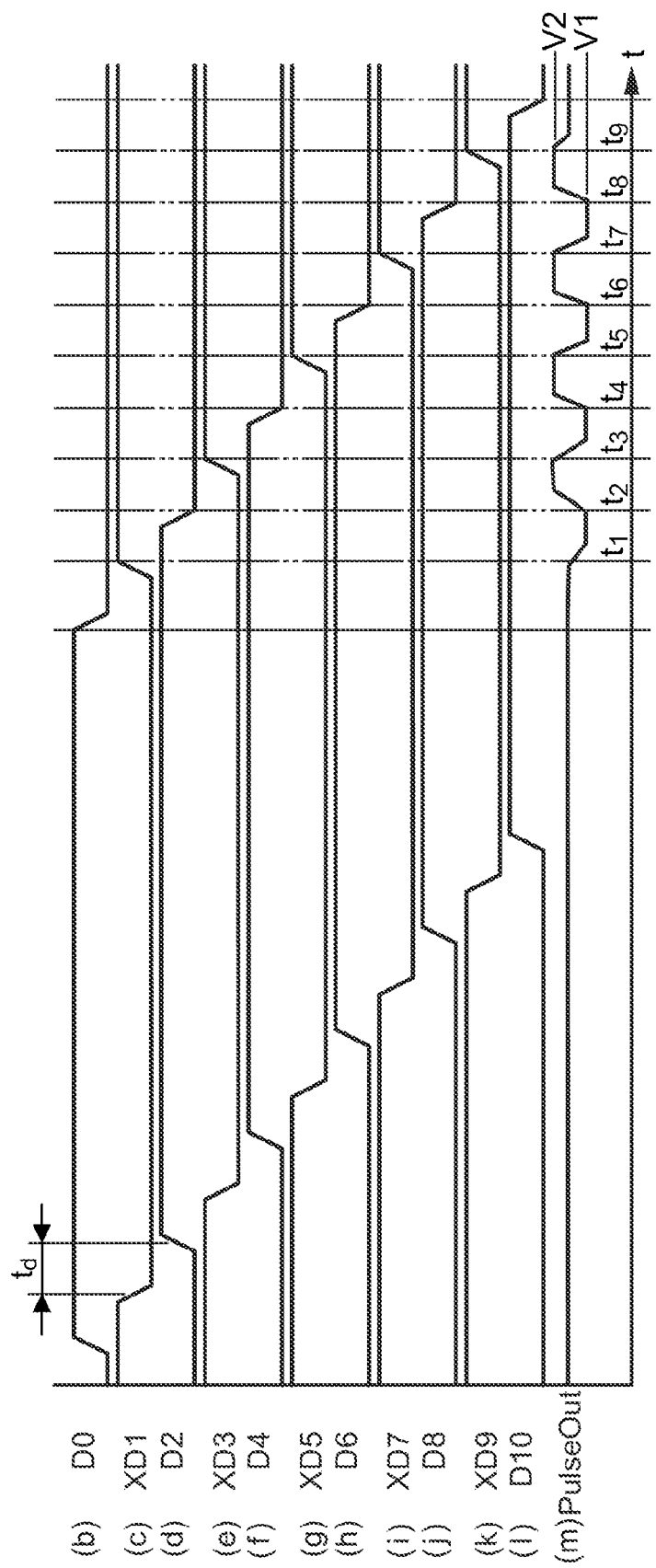
FIG. 14 is an operational time chart of another pulse generation circuit of the related art.

FIGS. 8 through 10 are diagrams for explaining substantial parts of an electronic device using any one of the pulse generation circuits according to the first through third embodiments, and show an example of the case in which the invention is applied to a UWB communication device.

The UWB transmission circuit 701 includes the pulse generation circuit shown in FIG. 1 or 3. A terminal 703 is a terminal for inputting the start signal, and a terminal 704 is an input terminal for the data to be transmitted. Modulation is executed on the pulse to be generated in accordance with a signal input to the terminal 704, and the method of the modulation will be described later.

The pulse generation circuit of the second embodiment (FIG. 3) has two output terminals to generate differential pulse signals. Therefore, the transmitter using this pulse generation circuit is capable of driving a balanced antenna. Although the case in which the transmitter drives a balanced antenna 702 is exemplified in FIG. 8, it is also possible to generate the pulse with a single-ended output using the pulse generation circuit according to the first embodiment (FIG. 1) to drive an unbalanced antenna such as a monopole antenna or to drive a balanced antenna via a Balun (a balance-unbalance transforming circuit).

As the modulation method, the Bi-Phase Modulation (BPM) of a pulse for modulating the pulse by switching the polarity of the pulse to be output along the value of the transmission data input to the input terminals 703, 704, the Pulse Position Modulation (PPM) for connecting delay circuit to the start signal and switching the delay time along the transmission data, and so on can be adopted.

FIG. 9 shows the modulation circuit of the PPM. A terminal 715 is a terminal for inputting the start signal. A signal delayed by a delay circuit 717 and a direct signal without passing through the delay circuit 717 are formed from the input signal, and a switch 719 selects one from these signals. By arranging that either one of the signal passing through the delay circuit 717 and the signal not passing through the delay circuit 717 is selected based on whether a value of the bit of the transmission data input to the terminal 716 is 1 or 0, it is possible to shift the start signal for the delay time of the delay circuit based on the value of the transmission data, thus the PPM modulation can be performed.

The start signal on which the PPM modulation is executed by the switch 179 is divided in frequency by two by a ½ frequency dividing circuit (÷2) 718. Thus, the signal inverted in accordance with either one of the rising edge or falling edge of the start signal input to the terminal 715 can be obtained. The pulse generation circuit 721 is a circuit described in the first or the second embodiment. Since the pulse generation circuit generates the pulses in accordance with the both edges of the start signal, the pulses are generated (with a predetermined temporal delay caused by the PPM conversion) every edge of the ½ frequency dividing circuit 718, namely corresponding to either one of the rising edges and the falling edges of the start signal input to the terminal 715. In the PPM, either of the pulse generation circuits of the first and second embodiments can be used.

Although in the circuit shown in FIG. 9, if the order of the circuits surrounded by the dashed line 720 and the ½ frequency dividing circuit 718 is reversed, the circuits can be operated in a similar way, according to the connection shown in the drawing, the logic circuit forming the switch 719 becomes simpler and the jitter of the pulses thus generated can be suppressed to a reduced level.

FIG. 10 shows the case of using the BPM as the modulation method. The pulse start signal input to the terminal 722 is divided in the frequency by the ½ frequency dividing circuit (÷2) 724 and converted into the signal inverted in response to either one of the rising edges and falling edges of the pulse start signal input to the terminal 722. The signal is input to the start terminal of the pulse generation circuit 725. As the pulse generation circuit 725, the circuit according to the second embodiment can be used. The pulse generated by the pulse generation circuit 725 is switched by a switch 726 to invert the polarity thereof based on the transmission data applied to a terminal 723. According to this operation, balanced pulses on which the BPM modulation is executed are obtained on terminals 727.

Further, by using the quadrature pulse generation circuit of the third embodiment, the pulse modulation of the IQ quadrature modulation becomes possible. Specifically, the circuit of the switch 726 shown in FIG. 10 is connected to each of a pair of signals I, XI and a pair of signals Q, XQ shown in FIG. 6 to execute the modulation (quadrature phase modulation (QPM)) on each of the signals I, Q, and further the two signals obtained by adding the respective signals I+Q, XI+XQ are fed to the balanced antenna.

In FIG. 8, the right section started from an antenna 705 shows a configuration of a reception circuit. Specifically, the UWB pulse signal received by the reception antenna 705 is amplified by a low-noise amplification circuit 706, and then input to mixer circuits 707 and 708 of I and Q, respectively. The mixer circuits 707, 708 execute multiplications on the input signal with template pulses generated by template pulse generation circuits 709 to send the results to integration circuits (∫) 710, 711, respectively. The integration circuits 710, 711 remove high-frequency components of the signals thus mixed (multiplied) by the mixer circuits 707, 708, respectively, to execute demodulation. The judgment circuit 712 checks the intensity of each of the signals to judge the transmitted bit, and revert it to the transmitted data.

Here, as the template pulse generation circuits 709, the pulse generation circuit according to the third embodiment of the invention can be used. The pulse generation circuit can oscillate IQ bi-phase differential signals, and making it possible to use differential circuits as the low-noise amplification circuit 706 and the mixer circuits 707, 708. The differential circuits cancel common-mode noise, and are suitable for low-voltage operations, and therefore convenient for low-power and low-noise device configuration. Further, by using the IQ template by the pulse generation circuit according to the third embodiment, effective reception can be performed not only in the QPM, but also in the BPM and the PPM. Specifically, in the modulation process of the BPM and the PPM, it is possible to adopt a method, for example, of providing the I channel to data demodulation while using the Q channel for tracking. This is because, by controlling the timing of the template generation so as to make the Q channel output become always zero, the output amplitude value becomes the maximum in the I channel, and according to such control, the tracking of synchronous detection becomes possible.

It is obvious that the other circuits according to the invention, namely the circuits of the first and second embodiments can also be used as the template pulse generation circuits. In the case of using the circuit of the first embodiment, unbalanced circuits are used as the low-noise amplification circuit 706 and the mixer circuits 707, 708. Further, in the case in which the two channels of templates I and Q are necessary, it is possible to use two circuits each corresponding to one of the circuits according to the first and second embodiments, and start with a predetermined time difference.

The pulse generation circuit according to any one of the embodiments of the invention is capable of generating a signal having a small variation in amplitude between the signals, good balancing, and low distortion with a simple circuit configuration. Moreover, the power consumption is low. Therefore, the pulse generation circuit according to any one of the embodiments of the invention meets all of the required specifications necessary for improvement in performance of the UWB communication device, such as differential signal generation, IQ signal generation, or low distortion. Therefore, by applying the pulse generation circuit according to any one of the embodiments of the invention to the UWB communication device, a high-performance device can be realized.

Further by realizing the present circuit as a CMOS integrated circuit, power is consumed only in transition durations while generating the pulses, thus a so-called idling current can be eliminated. In the case of applying the circuit to communication devices, it is possible to always operate with the minimum power consumption in accordance with an amount of information (a bit rate) to be transmitted.

The invention has a particularly significant advantage when applied to the UWB communication using short pulses.

The entire disclosure of Japanese Patent Application No. 2007-267490, filed Oct. 15, 2007 is expressly incorporated by reference herein.

What is claimed is:

1. A pulse generation circuit for outputting a pulse with a predetermined waveform to an output terminal in response to a start signal, comprising:
   an inverter delay circuit including a plurality of inverters connected in series and each executing logic inversion on the start signal with a predetermined amount of delay;
   a first switching circuit adapted to connect the output terminal to a first voltage V1 when a logical product of an output Di (i denotes an even number in a predetermined range) of an ith inverter of the inverter delay circuit and an output XDi−1 of an i−1th inverter of the inverter delay circuit is true, and to connect the output terminal to a second voltage V2 when a logical sum of the output Di of the ith inverter of the inverter delay circuit and an output XDi+1 of an i+1th inverter of the inverter delay circuit is false;
   a second switching circuit adapted to connect the output terminal to the first voltage V1 when a logical product of the output Di of an ith inverter of the inverter delay circuit and the output XDi+1 of the i+1th inverter of the inverter delay circuit is true, and to connect the output terminal to the second voltage V2 when a logical sum of the output XDi+1 of the i+1th inverter of the inverter delay circuit and an output Di+2 of an i+2th inverter of the inverter delay circuit is false; and
   a start signal control circuit adapted to input the start signal to the inverter delay circuit with a delay equal to an amount of delay of every inverter of the inverter delay circuit when the first switching circuit is activated, and to input the start signal to the inverter delay circuit without the delay when the second switching circuit is activated.

2. The pulse generation circuit according to claim 1, wherein the start signal control circuit is configured including an inverter adapted to invert in logic and output one of two start signals having logic inverted from each other and substantially identical transition timing, and a switching circuit adapted to select one of the other of the two start signals and the output of the inverter.

3. A UWB communication device, comprising:
   the pulse generation circuit according to claim 1.

4. A pulse generation circuit adapted to output two sets of pulses with predetermined shapes to first, second and third, fourth output terminals, respectively, in a balanced manner in response to a start signal, comprising:
   a delay circuit including a plurality of delay elements connected in series, each adapted to form two delayed signals with a predetermined amount of delay from the start signal, having logics reversed to each other, and transition timing substantially identical to each other;
   a first switching circuit adapted to connect the first output terminal to a first voltage V1 when a logical product of an output D2i (i denotes an even number in a predetermined range) of a 2ith delay element of the delay circuit and an output XD2i−2 of an 2i−2th delay element of the delay circuit is true, and to connect the first output terminal to a second voltage V2 when a logical sum of the output D2i of the 2ith delay element of the delay circuit and an output XD2i+2 of an 2i+2th delay element of the delay circuit is false;
   a second switching circuit adapted to connect the second output terminal to the first voltage V1 when a logical product of the output D2i of the 2ith delay element of the delay circuit and the output XD2i+2 of the 2i+2th delay element of the delay circuit is true, and to connect the second output terminal to the second voltage V2 when a logical sum of the output XD2i+2 of the 2i+2th delay element of the delay circuit and an output D2i+4 of an 2i+4th delay element of the delay circuit is false;
   a third switching circuit adapted to connect the first output terminal to the first voltage V1 when a logical product of the output XD2i of the 2ith delay element of the delay circuit and the output D2i−2 of the 2i−2th delay element of the delay circuit is true, and to connect the first output terminal to the second voltage V2 when a logical sum of the output XD2i of the 2ith delay element of the delay circuit and the output D2i+2 of the 2i+2th delay element of the delay circuit is false;
   a fourth switching circuit adapted to connect the second output terminal to the first voltage V1 when a logical product of the output XD2i of the 2ith delay element of the delay circuit and the output D2i+2 of the 2i+2th delay element of the delay circuit is true, and to connect the second output terminal to the second voltage V2 when a logical sum of the output D2i+2 of the 2i+2th delay element of the delay circuit and the output XD2i+4 of the 2i+4th delay element of the delay circuit is false;
   a fifth switching circuit adapted to connect the third output terminal to the first voltage V1 when a logical product of an output D2i−1 of an 2i−1th delay element of the delay circuit and an output XD2i−3 of an 2i−3th delay element of the delay circuit is true, and to connect the third output terminal to the second voltage V2 when a logical sum of an output XD2i−1 of the 2i−1th delay element of the delay circuit and an output D2i+1 of an 2i+1th delay element of the delay circuit is false;
   a sixth switching circuit adapted to connect the fourth output terminal to the first voltage V1 when a logical product of the output D2i−1 of the 2i−1th delay element of the delay circuit and an output XD2i+1 of the 2i+1th delay element of the delay circuit is true, and to connect the fourth output terminal to the second voltage V2 when a logical sum of the output D2$i$+1 of the 2i+1th delay element of the delay circuit and the output XD2$i$+3 of the 2i+3th delay element of the delay circuit is false;

a seventh switching circuit adapted to connect the third output terminal to the first voltage V1 when a logical product of the output XD2$i$−1 of the 2i−1th delay element of the delay circuit and the output D2$i$−3 of the 2i−3th delay element of the delay circuit is true, and to connect the third output terminal to the second voltage V2 when a logical sum of the output XD2$i$−1 of the 2i−1th delay element of the delay circuit and the output D2$i$+1 of the 2i+1th delay element of the delay circuit is false; and an eighth switching circuit adapted to connect the fourth output terminal to the first voltage V1 when a logical product of the output XD2$i$−1 of the 2i−1th delay element of the delay circuit and the output D2$i$+1 of the 2i+1th delay element of the delay circuit is true, and to connect the fourth output terminal to the second voltage V2 when a logical sum of the output XD2$i$+1 of the 2i+1th delay element of the delay circuit and the output D2$i$+3 of the 2i+3th delay element of the delay circuit is false.

5. A pulse generation circuit adapted to output pulses with predetermined shapes to first and second output terminals in a balanced manner in response to a start signal, comprising:

a delay circuit including a plurality of delay elements connected in series, each adapted to form two delayed signals with a predetermined amount of delay from the start signal, having logics reversed to each other, and transition timing substantially identical to each other;

a first switching circuit adapted to connect a first output terminal to a first voltage V1 when a logical product of an output Di (i denotes an even number in a predetermined range) of an ith delay element of the delay circuit and an output XDi−1 of an i−1th delay element of the delay circuit is true, and to connect the first output terminal to a second voltage V2 when a logical sum of the output Di of the ith delay element of the delay circuit and an output XDi+1 of an i+1th delay element of the delay circuit is false;

a second switching circuit adapted to connect the second output terminal to the first voltage V1 when a logical product of the output Di of the ith delay element of the delay circuit and the output XDi+1 of the i+1th delay element of the delay circuit is true, and to connect the second output terminal to the second voltage V2 when a logical sum of the output XDi+1 of the i+1th delay element of the delay circuit and an output Di+2 of an i+2th delay element of the delay circuit is false;

a third switching circuit adapted to connect the first output terminal to the first voltage V1 when a logical product of the output XDi of the ith delay element of the delay circuit and the output Di−1 of the i−1th delay element of the delay circuit is true, and to connect the first output terminal to the second voltage V2 when a logical sum of the output XDi of the ith delay element of the delay circuit and an output Di+1 of the i+1th delay element of the delay circuit is false; and a fourth switching circuit adapted to connect the second output terminal to the first voltage V1 when a logical product of the output XDi of the ith delay element of the delay circuit and the output Di+1 of the i+1th delay element of the delay circuit is true, and to connect the second output terminal to the second voltage V2 when a logical sum of the output Di+1 of the i+1th delay element of the delay circuit and the output XDi+2 of the i+2th delay element of the delay circuit is false.

* * * * *